(12) United States Patent
Abe

(10) Patent No.: US 11,942,758 B2
(45) Date of Patent: Mar. 26, 2024

(54) SEMICONDUCTOR LASER DEVICE MANUFACTURING METHOD

(71) Applicant: Mitsubishi Electric Corporation, Tokyo (JP)

(72) Inventor: Shinji Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 419 days.

(21) Appl. No.: 17/424,869

(22) PCT Filed: Mar. 18, 2019

(86) PCT No.: PCT/JP2019/011157
§ 371 (c)(1),
(2) Date: Jul. 21, 2021

(87) PCT Pub. No.: WO2020/188695
PCT Pub. Date: Sep. 24, 2020

(65) Prior Publication Data
US 2022/0094136 A1 Mar. 24, 2022

(51) Int. Cl.
*H01S 5/0235* (2021.01)
*H01S 5/023* (2021.01)
(Continued)

(52) U.S. Cl.
CPC ............ *H01S 5/0235* (2021.01); *H01S 5/023* (2021.01); *H01S 5/02345* (2021.01); *H01S 5/028* (2013.01); *H01L 2224/48227* (2013.01)

(58) Field of Classification Search
CPC .... H01S 5/0235; H01S 5/023; H01S 5/02345; H01S 5/028; H01S 5/02476;
(Continued)

(56) References Cited

U.S. PATENT DOCUMENTS 5,612,258 A 3/1997 Tanaka

FOREIGN PATENT DOCUMENTS

JP H05-211374 A 8/1993
JP H05-251830 A 9/1993
(Continued)

OTHER PUBLICATIONS

International Search Report issued in PCT/JP2019/011157; dated May 28, 2019.
(Continued)

*Primary Examiner* — Elias Ullah
(74) *Attorney, Agent, or Firm* — Studebaker & Brackett PC

(57) ABSTRACT

A manufacturing method comprises: a material preparation step of forming a metal layer on a front side surface of a submount bar body which is to face a laser bar on which a front side electrode and a back side electrode are formed, to prepare a submount bar on which the laser bar is to be mounted; a jig installation step of installing the submount bar and the laser bar that are provided in plural number alternately stacked each other on an installation jig; a bonding step of bonding the metal layer and the back side electrode by increasing the temperature of the installation jig; and a protective film forming step of forming a protective film on cleaved end faces of the laser bar in a protective film forming apparatus using the installation jig in which the submount bars and the laser bars are installed, after the bonding step.

20 Claims, 14 Drawing Sheets

(51) Int. Cl.
*H01S 5/02345* (2021.01)
*H01S 5/028* (2006.01)

(58) Field of Classification Search
CPC .. H01S 5/0282; H01S 5/0202; H01S 5/04252; H01S 5/4031; H01S 5/02355; H01L 2224/48227
See application file for complete search history.

(56) References Cited

FOREIGN PATENT DOCUMENTS

| | | |
|---|---|---|
| JP | H08-018150 A | 1/1996 |
| JP | H09-148623 A | 6/1997 |
| JP | 2002-164359 A | 6/2002 |
| JP | 2010-114269 A | 5/2010 |

OTHER PUBLICATIONS

Higurashi, Eiji et al.; "Low-Temperature Bonding Technologies Realizing High-Functional Optical Microsystems and Sensors"; Journal of the Japan Society for Precision Engineering; May 26, 2013; pp. 719-724; vol. 79, No. 8.

SEMICONDUCTOR LASER DEVICE MANUFACTURING METHOD

TECHNICAL FIELD

The present application relates to a method of manufacturing a semiconductor laser device in which a protective film is formed on an end face of the semiconductor laser.

BACKGROUND ART

A semiconductor laser in which an optical resonator is formed parallel to the semiconductor substrate and emits light from its cleaved end face is referred to as an edge-emitting laser. Since the reflectance of the edge-emitting laser needs to be adjusted for laser oscillation, a protective film consisting of an oxide film such as $Al_2O_3$, $SiO_2$, or a nitride film such as SiN, or the like needs to be formed on the cleaved end face. A semiconductor laser has one or more light-emitting regions where laser light is emitted.

In order to form a protective film on cleaved end faces of a semiconductor laser bar, which is a bar-shaped semiconductor laser, it is necessary to install the semiconductor laser bar in a jig. If only a plurality of semiconductor laser bars is installed in the jig, stress is applied to each bar, and in addition, a temperature rise during the formation of the protective film causes the electrodes of adjacent semiconductor laser bars to bond to each other. If the semiconductor laser bars are bonded to each other, the semiconductor laser bars cannot be separated after the protective film is formed. In order to solve this problem, spacers are inserted between the adjacent semiconductor laser bars at the installation of the semiconductor laser bars (refer to FIG. 5 of Patent Document 1). In the protective film forming method shown in FIG. 5 of Patent Document 1, with alignment jigs corresponding to spacers brought into contact with electrode surfaces of the semiconductor laser bars, the plurality of semiconductor laser bars is fixed to an installation jig consisting of a support stand and a fixing jig. In this case also, since the temperature rises during the protective film formation, gaps are generated between the semiconductor laser bars and the spacers, and protective film particles enter these gaps and adhere to the electrode surfaces of the semiconductor laser bars.

In general, after the protective film is formed on the cleaved end faces of the semiconductor laser bar, the semiconductor laser bar is cut as a semiconductor laser for each of light emitting regions and the semiconductor laser is fixed and mounted on a submount by using solder. However, when the protective film adheres to the electrode surface of the semiconductor laser, the wettability of the solder becomes poor, resulting in an unbonded area between the submount and the electrode surface (electrode surface on the back side) of the semiconductor laser facing the submount. If there is an unbonded area between the submount and the semiconductor laser, the heat dissipation of the heat generated during driving of the semiconductor laser is reduced, and thus the semiconductor laser deteriorates. In the semiconductor laser, the electrode surface (electrode surface on the front side) on the side opposite to the surface facing the submount is connected to an external electrode, etc. by wires or the like.

Patent Document 1 discloses a method of preventing the protective film from adhering to the surface of an electrode formed on a submount on which a semiconductor laser is mounted. In the protective film forming method shown in FIG. 3 of Patent Document 1, after the end faces of the semiconductor laser are formed by cleavage, the semiconductor laser is separated into semiconductor laser chips for each light emitting region, the electrode surface on the back side of the semiconductor laser chip and the die bonding portion of the submount are fixed, and the electrode on the front side of the semiconductor laser and the first front side electrode of the submount are wire-bonded. Thereafter, the submounts are disposed side by side on a metal carrier, the second front side electrode connected to the die-bonding portion of the submount is covered with a heat resistant sheet, and a protective film is formed on the cleaved end faces of the semiconductor laser by a sputtering apparatus or a vapor deposition apparatus.

CITATION LIST

Patent Document

Patent Document 1: Japanese Patent Application Laid-open No. H8-18150 (FIGS. 3, 5)

SUMMARY OF INVENTION

Problems to be Solved by Invention

The end face of the edge-emitting laser is formed by cleaving, but since the cleaving is generally performed in air, natural oxidation of the cleaved end face begins immediately after the cleaving. In particular, it is known that for edge-emitting lasers made of GaAs and AlGaAs based material, the oxidation of the cleaved end face causes many interface states to be occurred at the interface between the protective film to be formed afterwards and the cleaved end face. The presence of the interface states decreases the band gap of the emitting region (active layer region), and thus the laser light is absorbed and heat is generated. When the temperature near the cleaved end face rises, the band gap of the emitting region (active layer region) decreases further, causing positive feedback that increases the amount of laser light absorbed. As a result, catastrophic optical damage (COD) degradation occurs, which eventually leads to melting of the cleaved end face.

In the protective film forming method shown in FIG. 3 of Patent Document 1, since the electrode surface on the back side of the semiconductor laser is bonded to the die-bonding portion of the submount before forming the protective film, and the second front side electrode of the submount is covered with the heat resistant sheet, the protective film can be prevented from adhering to the die-bonding portion of the submount and the second electrode surface connected to the die bonding portion. However, since the method shown in FIG. 3 of Patent Document 1 requires many steps between the formation of the cleaved end faces and the formation of the protective film, oxidation of the cleaved end faces progresses. Therefore, the protective film forming method shown in FIG. 3 of Patent Document 1 has a problem in that, after the protective film is formed, many interface states are occurred at the interface between the cleaved end face and the protective film, resulting in the element degradation caused by the end face, such as COD degradation.

The technology disclosed in the present application aims to provide a semiconductor laser device manufacturing method that can prevent the protective film from adhering to the electrode surface of the semiconductor laser on the side that is to be bonded to the submount when the protective film on the cleaved end faces are formed, and can form the protective film on the cleaved end faces of the semiconductor laser with natural oxide film reduced compared with the conventional method.

Means for Solving Problems

An example of a semiconductor laser device manufacturing method disclosed in the specification of the present application is a method of manufacturing the semiconductor laser device in which a protective film is formed on cleaved end faces of a semiconductor laser bar which is a bar-shaped semiconductor laser. The semiconductor laser bar has a front side electrode formed on one surface different from the cleaved end faces and has a back side electrode formed on a surface opposite to the one surface. The semiconductor laser device manufacturing method includes: a material preparation step of forming a metal layer on a front side surface of a bar-shaped submount bar body which is to face the semiconductor laser bar, to prepare a bar-shaped submount bar on which the semiconductor laser bar is to be mounted; a jig installation step of installing the submount bar and the semiconductor laser bar that are provided in plural number alternately stacked on an installation jig such that the metal layer of the submount bar and the back side electrode of the semiconductor laser bar face each other; a bonding step of bonding the metal layer and the back side electrode by increasing the temperature of the installation jig in which the submount bar and the semiconductor laser bar that are provided in plural number are installed; and a protective film forming step of forming the protective film on the cleaved end faces of the semiconductor laser bar in a protective film forming apparatus using the installation jig in which the submount bar and the semiconductor laser bar that are provided in plural number are installed, after the bonding step.

Effect of Invention

In an example of the semiconductor laser device manufacturing method disclosed in the specification of the present application, the submount bar and the semiconductor laser bar that are provided in plural number are alternately stacked and installed on the installation jig, and after the metal layer of the submount bar and the back side electrode of the semiconductor laser bar are bonded, the protective film is formed on the cleaved end faces of the semiconductor laser bar, so that, when the protective film is formed on the cleaved end faces of the semiconductor laser, adhesion of the protective film to the electrode surface of the semiconductor laser on the side where the submount is bonded can be prevented, and the protective film can be formed on the cleaved end faces of the semiconductor laser in which the natural oxide film is reduced more than in the conventional method.

MODES FOR CARRYING OUT INVENTION

Embodiment 1

Figure 1:
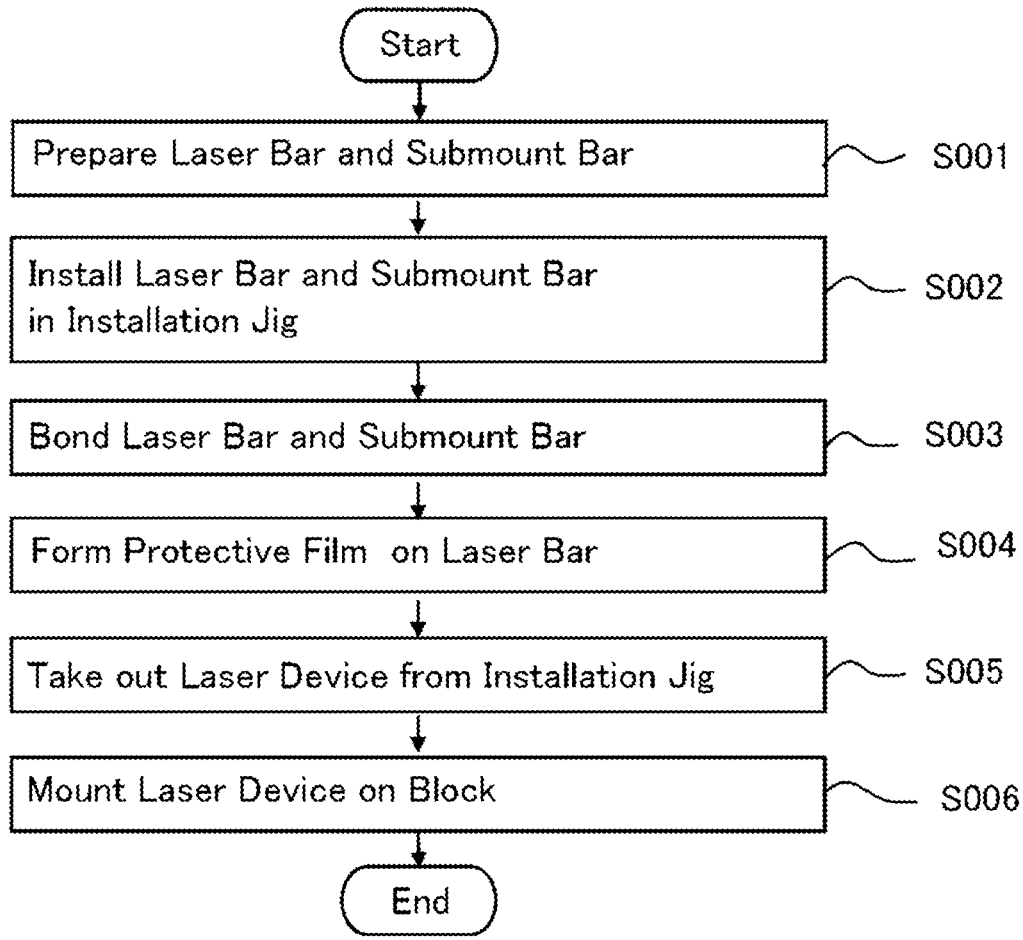
FIG. 1 is a flow diagram of a semiconductor device manufacturing method including an end face protective film forming method for a semiconductor laser and a semiconductor laser device manufacturing method according to Embodiment 1.
Figure 2:
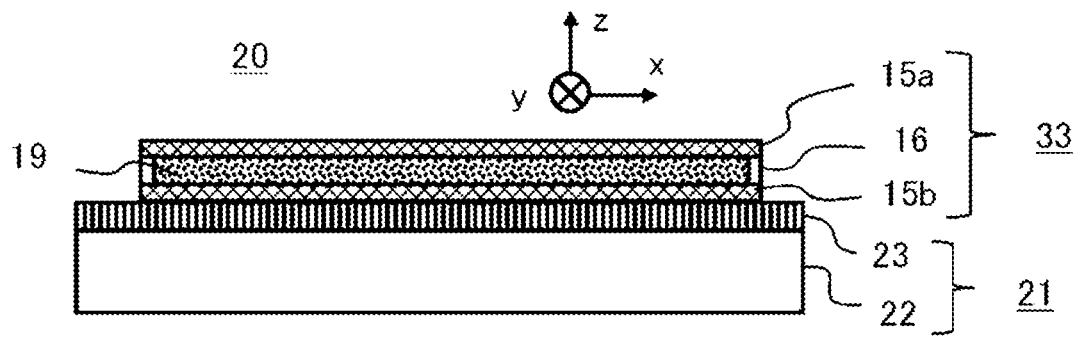
FIG. 2 is a diagram showing a semiconductor laser device according to Embodiment 1.
Figure 3:
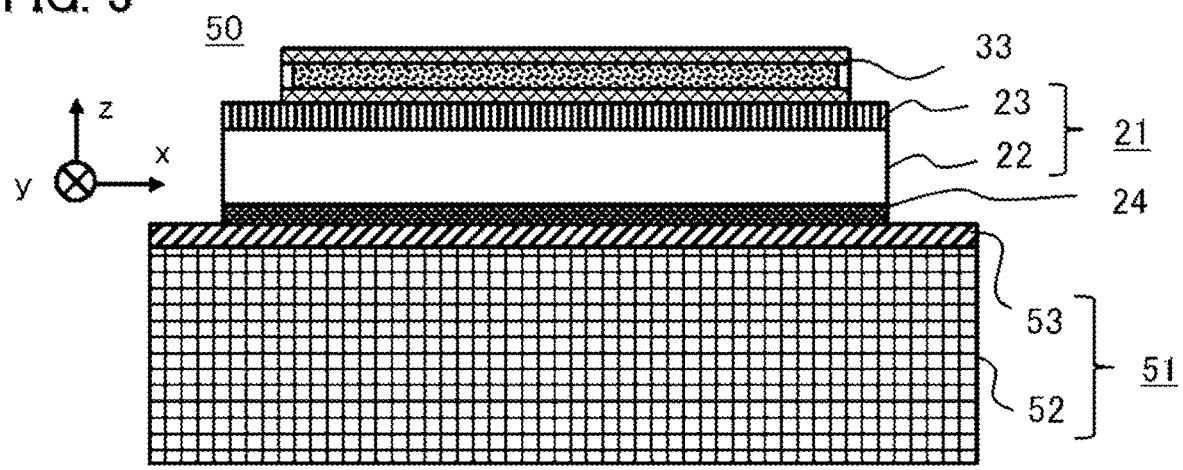
FIG. 3 is a diagram showing a semiconductor device according to Embodiment 1.
Figure 4:
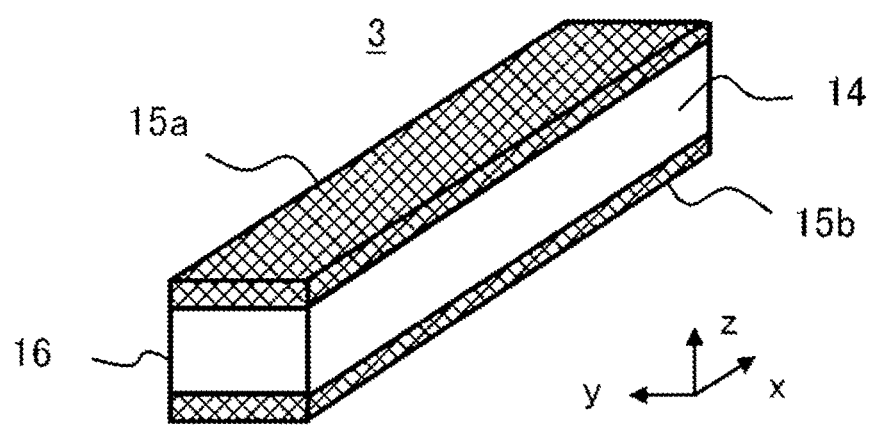
FIG. 4 is a bird's eye view of a semiconductor laser bar according to Embodiment 1.
Figure 5:
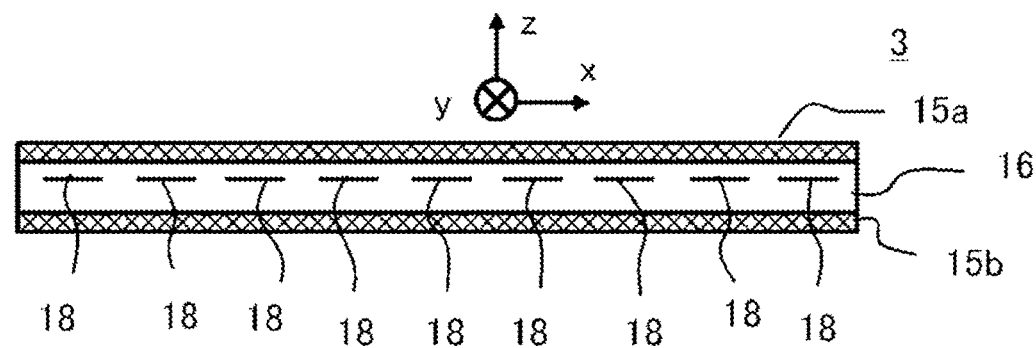
FIG. 5 is a cross sectional view of the semiconductor laser bar of FIG. 4 perpendicular to the y-direction.
Figure 6:
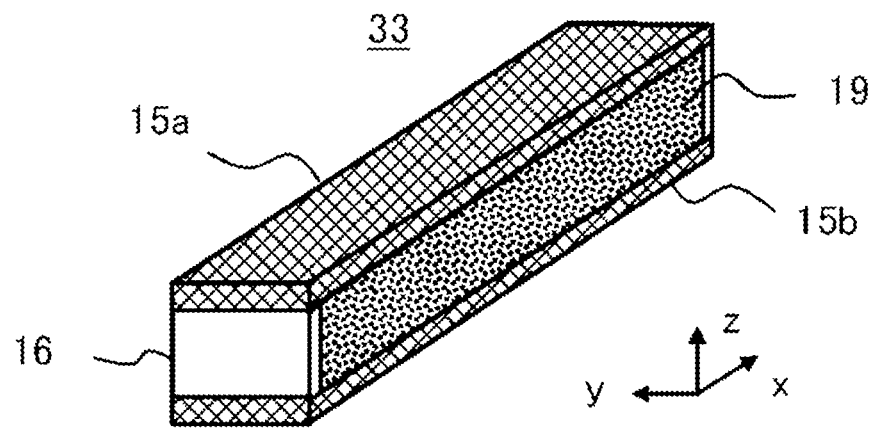
FIG. 6 is a bird's eye view of the semiconductor laser bar of FIG. 2 with a protective film formed thereon.
Figure 7:
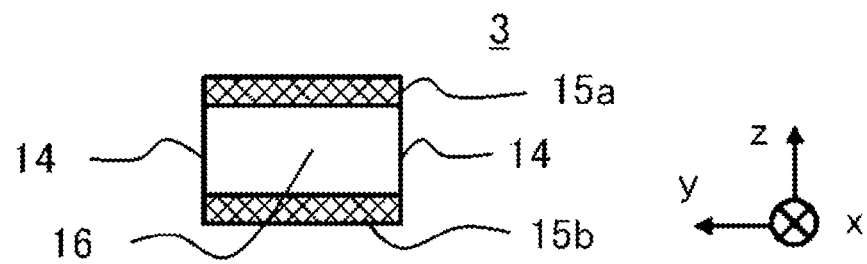
FIG. 7 is a cross sectional view of the semiconductor laser bar of FIG. 4 perpendicular to the x-direction.
Figure 8:
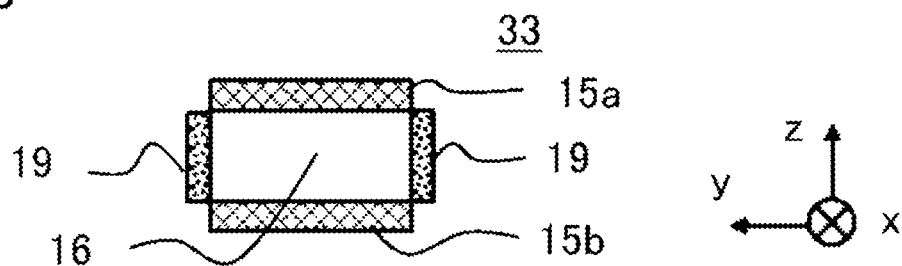
FIG. 8 is a cross sectional view of the semiconductor laser bar of FIG. 6 perpendicular to the x-direction.
Figure 9:
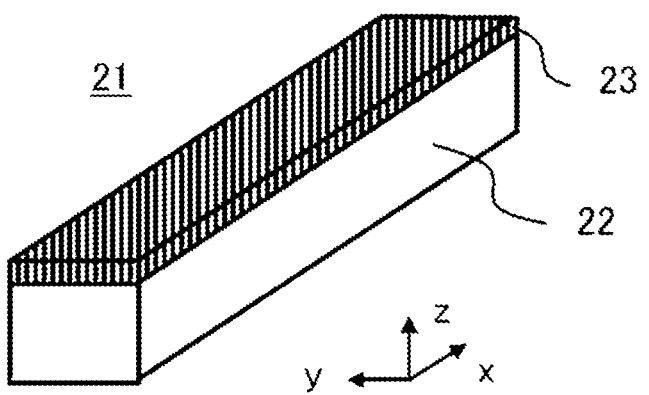
FIG. 9 is a bird's eye view of a submount bar of FIG. 2.
Figure 10:
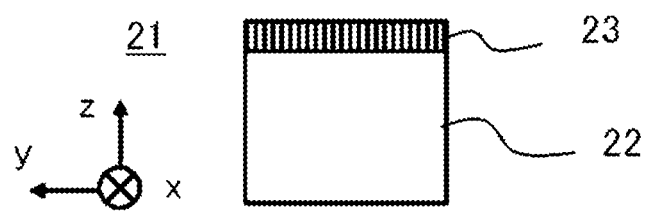
FIG. 10 is a cross sectional view of the submount bar of FIG. 9 perpendicular to the x-direction.
Figure 11:
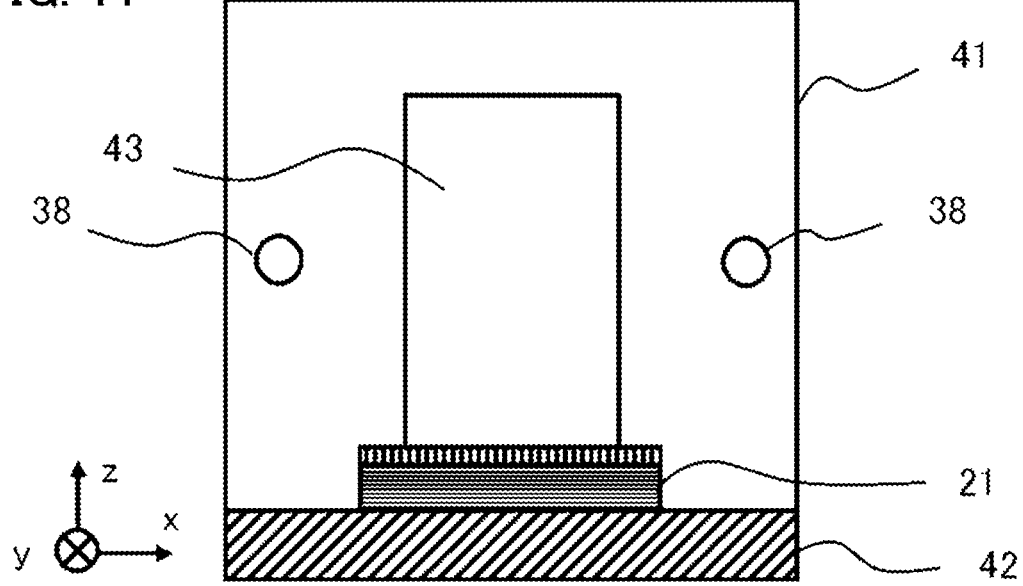
FIG. 11 is a diagram illustrating a method of installing the semiconductor laser bar of FIG. 4 and the submount bar of FIG. 9 in an installation jig.
Figure 12:
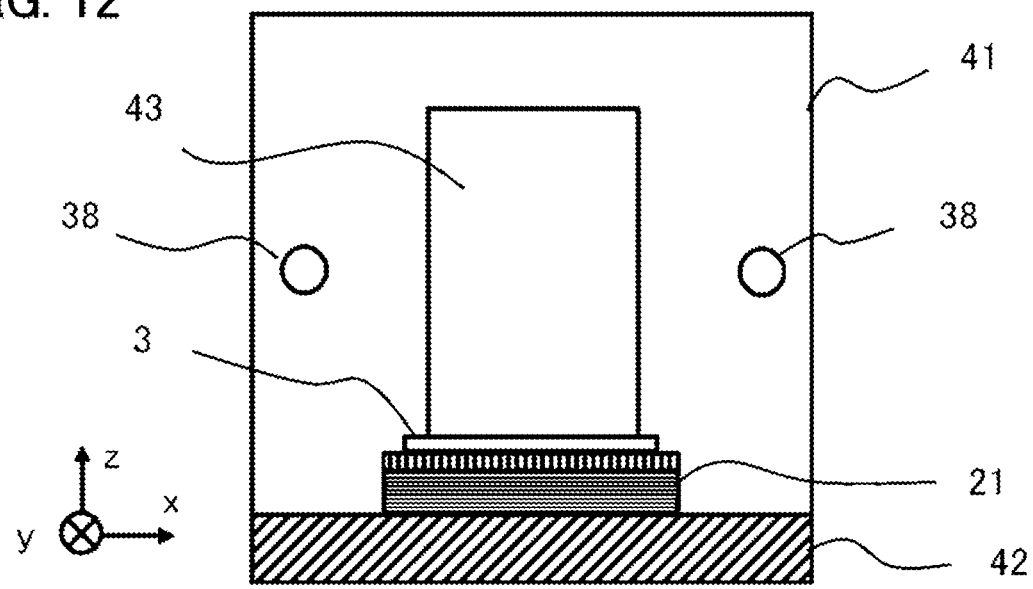
FIG. 12 is a diagram illustrating the method of installing the semiconductor laser bar of FIG. 4 and the submount bar of FIG. 9 in the installation jig.
Figure 13:
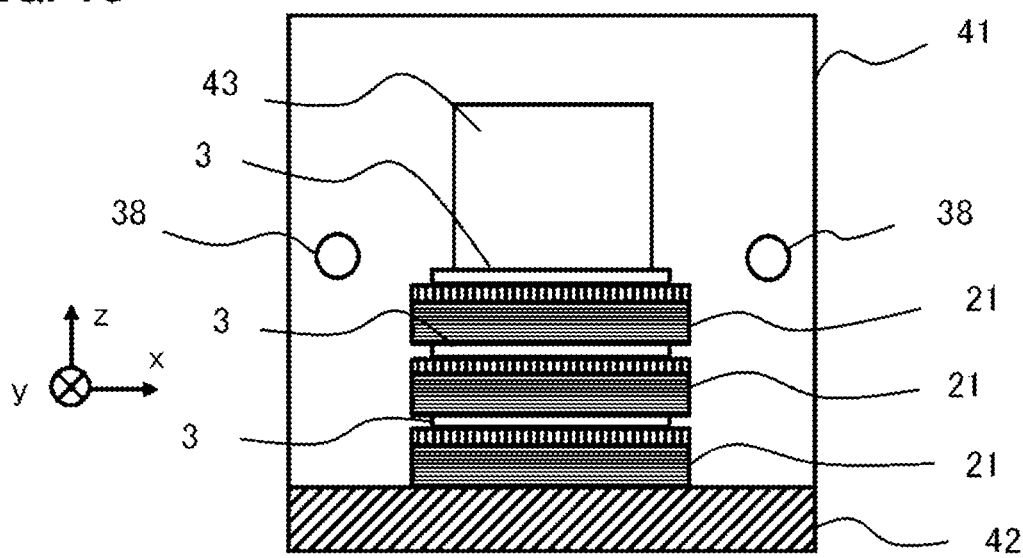
FIG. 13 is a diagram illustrating the method of installing the semiconductor laser bar of FIG. 4 and the submount bar of FIG. 9 in the installation jig.
Figure 14:
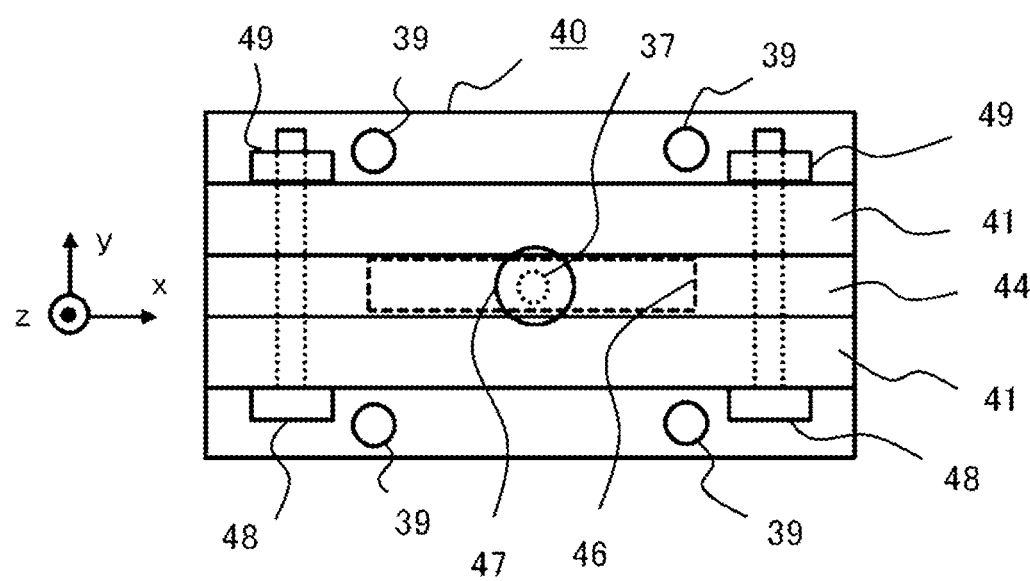
FIG. 14 is a diagram showing the installation jig according to Embodiment 1.
Figure 15:
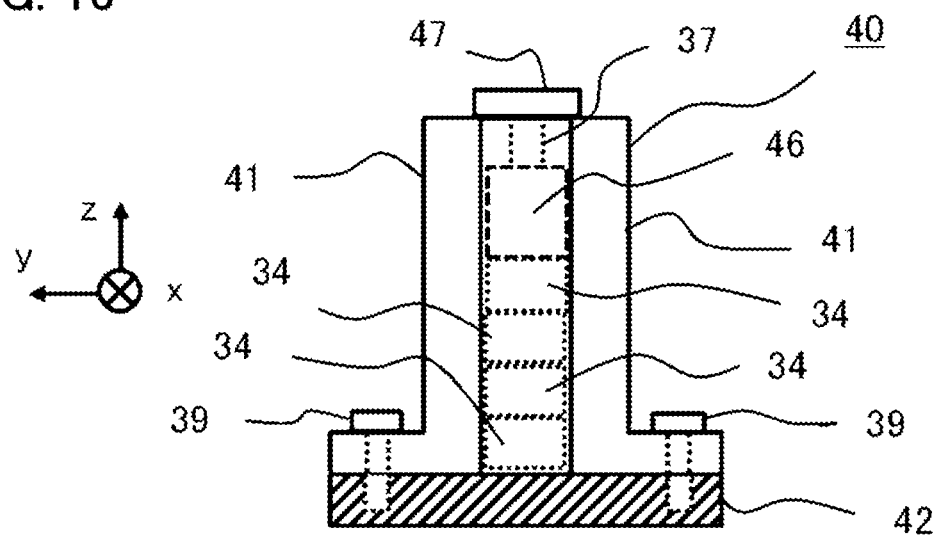
FIG. 15 is a side view of the installation jig of FIG. 14 in the x-direction.
Figure 16:
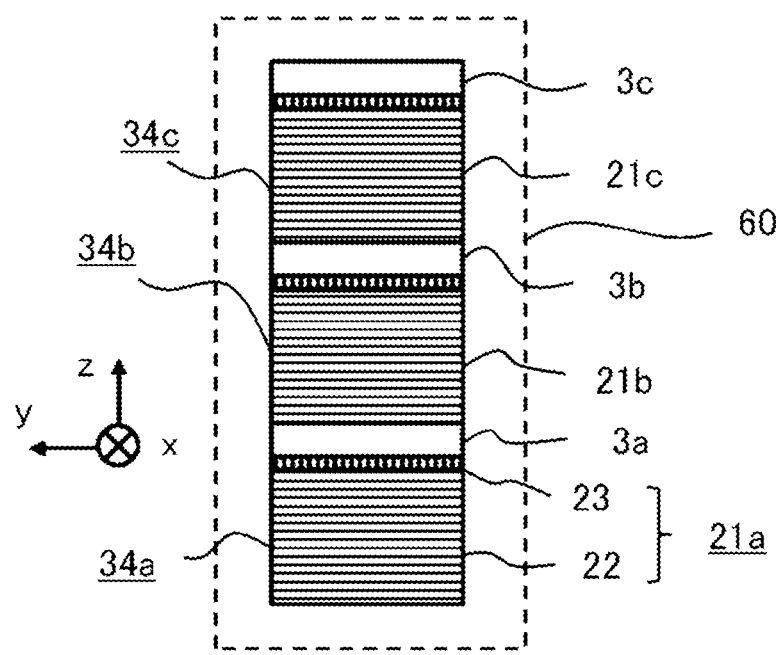
FIG. 16 is a diagram illustrating a bonding step according to Embodiment 1.
Figure 17:
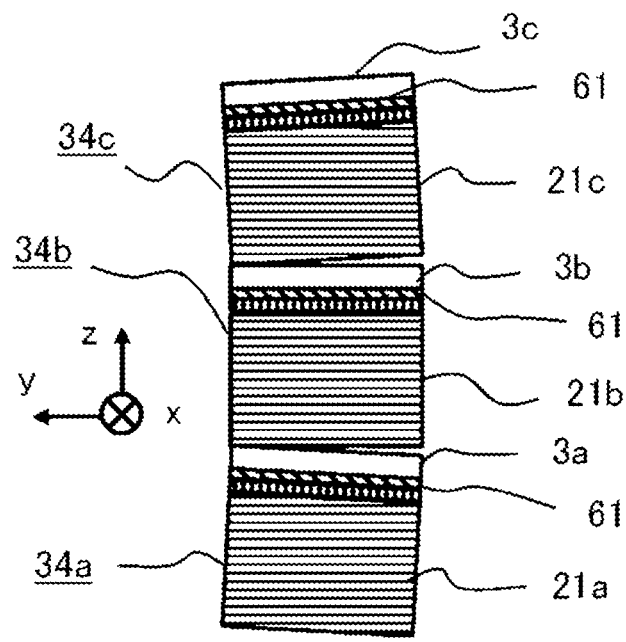
FIG. 17 is a diagram illustrating a bonding step according to Embodiment 1.
Figure 18:
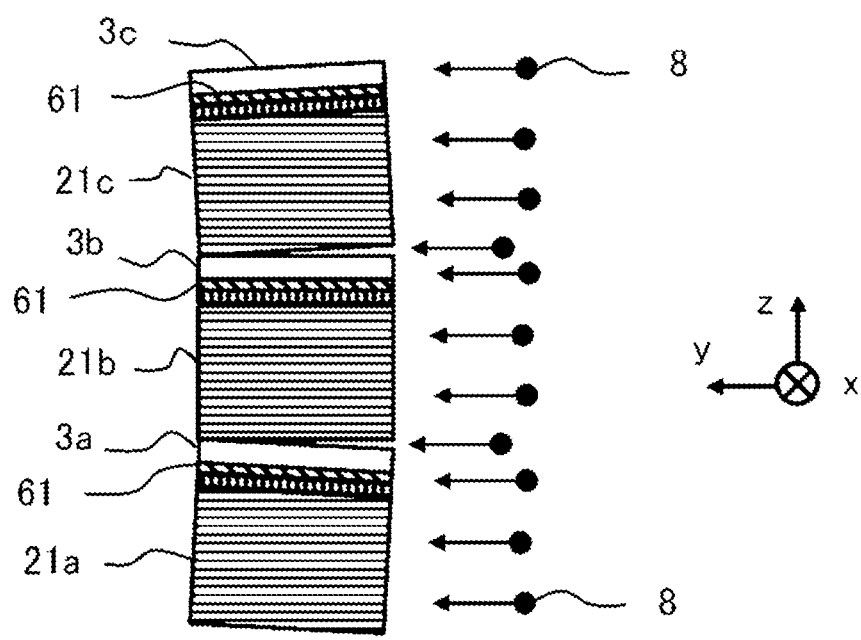
FIG. 18 is a diagram illustrating a protective film forming step according to Embodiment 1.
Figure 19:
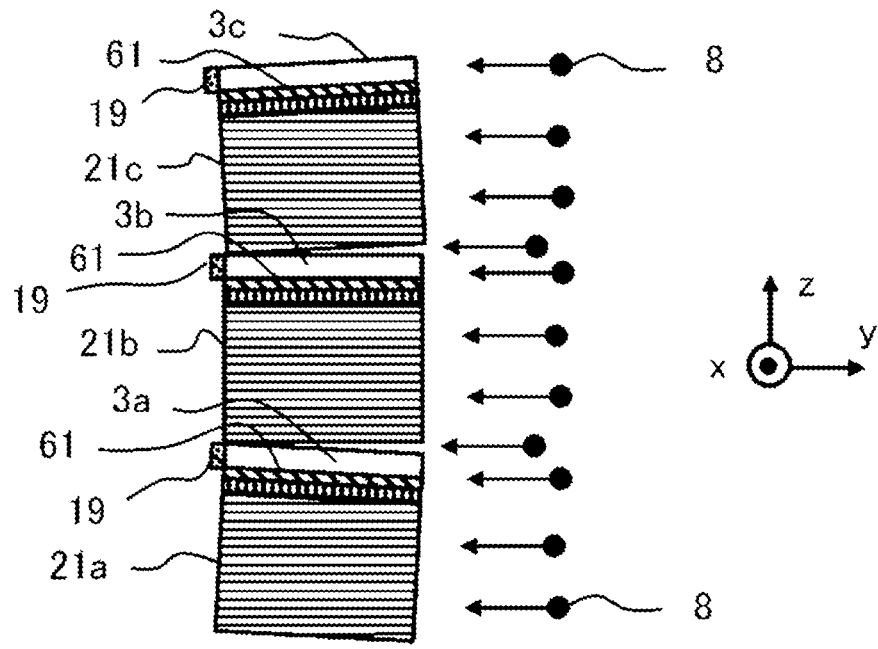
FIG. 19 is a diagram illustrating a protective film forming step according to Embodiment 1.

An end face protective film forming method for a semiconductor laser, a semiconductor laser device manufacturing method, a semiconductor device manufacturing method, a semiconductor laser device 20 and a semiconductor device 50 according to Embodiment 1 will be described referring to the drawings. The same or corresponding components are denoted by the same reference numerals, and repetitive description may be omitted. FIG. 1 is a flow diagram of a semiconductor device manufacturing method including an end face protective film forming method for a semiconductor laser and a semiconductor laser device manufacturing method according to Embodiment 1. FIG. 2 is a diagram showing a semiconductor laser device according to Embodiment 1 and FIG. 3 is a diagram showing a semiconductor device according to Embodiment 1. FIG. 4 is a bird's eye view of a semiconductor laser bar according to Embodiment 1 and FIG. 5 is a cross sectional view of the semiconductor laser bar of FIG. 4 perpendicular to the y-direction. FIG. 6 is a bird's eye view of the semiconductor laser bar of FIG. 2 with a protective film formed thereon. FIG. 7 is a cross sectional view of the semiconductor laser bar of FIG. 4 perpendicular to the x-direction and FIG. 8 is a cross sectional view of the semiconductor laser bar of FIG. 6 perpendicular to the x-direction. FIG. 9 is a bird's eye view of a submount bar of FIG. 2, and FIG. 10 is a cross sectional view of the submount bar of FIG. 9 perpendicular to the x-direction. FIGS. 11, 12, and 13 each are diagrams illustrating a method of installing the semiconductor laser bar of FIG. 4 and the submount bar of FIG. 9 in an installation jig. FIG. 14 is a diagram showing the installation jig according to Embodiment 1, and FIG. 15 is a side view of the installation jig of FIG. 14 in the x-direction. FIGS. 16 and 17 each are diagrams illustrating a bonding step according to Embodiment 1. FIGS. 18 and 19 each are diagrams illustrating a protective film forming step according to Embodiment 1.

A semiconductor laser device 20 includes a semiconductor laser bar 33 which is a bar-shaped semiconductor laser having a protective film 19 formed on cleaved end faces 14, and a submount bar 21 which is a bar-shaped submount having a main body and a metal layer 23. The main body of the sub-mount bar 21 is a submount bar body 22. The semiconductor laser bar 33 includes a semiconductor structure part 16 in which a plurality of light emitting regions 18 is formed, a surface side electrode 15a formed on a surface of the semiconductor structure part 16 (the surface opposite to the surface facing the submount bar 21), a back side electrode 15b formed on the back surface of the semiconductor structure part 16 (the surface facing the submount bar 21), and a protective film 19 formed on the cleaved end faces 14. Each of the front side electrode 15a and the back side electrode 15b is formed on a different surface from the cleaved end faces 14 of the semiconductor structure part 16. The reference numeral 3 denotes the semiconductor laser bar having no protective film 19 formed on the cleaved end faces 14. The semiconductor device 50 includes the semiconductor laser bar 33 and the submount bar 21 that are the semiconductor laser device 20, and a block 51 having a block main body 52 and a metal layer 53. The metal layer 53 is made of gold or the like. The metal layer 53 is formed on the surface of the block main body 52 (the surface facing the submount bar 21), and the semiconductor laser device 20 is mounted on the block 51 by being fixed thereto with solder 24 which is a brazing material. Here, the coordinate system of the semiconductor laser device 20 and the semiconductor device 50 will be described. The longitudinal direction and the lateral direction of the semiconductor laser bar 3 or 33 are respectively set to the x-direction and the y-direction, and the direction from the back side electrode 15b to the front side electrode 15a of the semiconductor laser bar 3 or 33 is set to the z-direction.

Referring to FIG. 1, an end face protective film forming method for the semiconductor laser, a semiconductor laser device manufacturing method, and a semiconductor device manufacturing method will be described. In step S001, the submount bar 21 and the semiconductor laser bar 3 that are formed in a bar shape are prepared (material preparation step). In step S002, the semiconductor laser bar 3 and the submount bar 21 that are provided in plural number are alternately stacked and installed on an installation jig 40 (jig installation step). In step S003, the installation jig 40 in which the semiconductor laser bar 3 and the submount bar 21 are fixed is installed in an end face protective film forming apparatus 60 for forming the protective film 19, and the semiconductor laser bar 3 and the submount bar 21 are bonded (bonding step). In step S004, the protective film 19 is formed on the cleaved end faces 14 of the semiconductor laser bar 3 in the end face protective film forming apparatus 60 (protective film forming step). In step S005, the installation jig 40 is taken out from the end face protective film forming apparatus 60, and the semiconductor laser device 20 having the semiconductor laser bar 33 with the protective film 19 formed on the cleaved end faces 14 is individually taken out from the installation jig 40 (semiconductor laser device unloading step). Step S001 up to step S005 are a method of manufacturing the semiconductor laser device 20, that is, the semiconductor laser device manufacturing method. When a product is manufactured using the semiconductor laser device 20, since there are subsequent steps, the semiconductor laser device manufacturing method of step S001 up to step S005 will be referred to as a semiconductor laser device manufacturing step. In step S006, the manufactured semiconductor laser device 20 is fixed to and mounted on the block 51 to manufacture the semiconductor device 50 (block mounting step). Step S001 up to step S006 are a semiconductor device manufacturing method of manufacturing the semiconductor device 50. Step S002 up to step S004 are of an end face protective film forming method for the semiconductor laser. Note that, the semiconductor device manufacturing method includes the semiconductor laser device manufacturing step and the block mounting step.

Next, each of the step S001 to step S006 will be described in detail. The material preparation step of step S001 includes a submount bar preparation step of preparing the submount bar 21 formed in a bar shape and a laser bar preparation step of preparing the semiconductor laser bar 3 formed in a bar shape. In the submount bar preparation step, the submount bar body 22 which is a plate-like semiconductor substrate of AlN, SiC or the like separated in a bar shape is produced, and the metal layer 23 of Au (gold) or the like is formed on a surface (front side surface) to which the back side electrode 15b of the semiconductor laser bar 3 is to be bonded, using a vapor deposition apparatus, a sputtering apparatus, plating technique or the like. The metal layer 23 is a metal layer to be bonded to the back side electrode 15b of the semiconductor laser bar 3, and needs to be a metal to be diffusion bonded with the metal. In the case of the diffusion bonded metal between dissimilar metals, the metal layer 23 may be made of Ag (silver), Pt (platinum) or the like. In general, the back side electrode 15b of the semiconductor laser bar 33 is made of gold, and in this case, the metal layer 23 is preferably made of gold.

In general, it is not preferable to apply a high temperature to the semiconductor laser, and the high temperature causes element degradation. In the case of gold bonding in which gold is bonded to gold, it has been found that the temperature required for bonding is low and is 150 to 200° C. in a high vacuum. An example of gold bonding at 150° C. in air is shown (refer to the Journal of the Japan Society for Precision Engineering, Vol. 79, No. 8, (2013), pp. 719-724). This temperature range does not adversely affect the semiconductor laser. In Embodiment 1, the metal layer 23 is not formed on the surface (back side surface) of the submount bar 21 which is not to be bonded to the semiconductor laser bar 3. As a result, even if the end face protective film is formed in a state in which the semiconductor laser bar 3 and the submount bar 21 that are provided in plural number are in contact with each other (see FIG. 13), the back side surface of the submount bar 21 and the front side electrode 15a of the semiconductor laser bar 33 are not bonded, namely, the semiconductor laser devices 20 are not bonded to each other, and the work of taking out the semiconductor laser device 20 from the installation jig 40 becomes easy.

In the laser bar preparation step, epitaxial layers that constitute the semiconductor laser structure are stacked on a semiconductor substrate made of GaAs, InP, etc. using metal-organic chemical vapor deposition (MOCVD) or molecular beam epitaxy (MBE) apparatus. Then, stripe regions are formed using photolithography technique, etching technique, and impurity implantation technique, etc. After that, a passivation film such as SiN, $SiO_2$, etc. is formed using a vapor deposition apparatus, a sputtering apparatus, chemical vapor deposition (CVD) apparatus, etc. In order to efficiently inject current for driving the semiconductor laser into the stripe region, the semiconductor substrate is thinned to form the semiconductor structure part 16. Then, a wafer having the light-emitting regions 18 of the semiconductor laser for several thousand elements is fabricated in which the semiconductor structure part 16 is provided with electrodes formed using a vapor deposition apparatus and a sputtering apparatus on the surface of the stacked structure and on the back side surface of the semiconductor substrate. Next, as shown in FIG. 4, the fabricated wafer is cleaved along the crystal axis direction to form the cleaved end faces 14, which are the end faces of the semiconductor laser, and is separated in a bar shape to fabricate the semiconductor laser bar 3. The front side electrode 15a, for example, has a layered structure of Ti (titanium)/Pt/Au. Au (gold) is the outermost surface metal. The back side electrode 15b is only gold or has a layered structure in which the outermost surface metal is gold. It is preferable that the outermost surface metal of the films that make up each of the front side electrode 15a and the back side electrode 15b be gold.

Next, the jig installation step of step S002 is performed. The semiconductor laser bar 3 and the submount bar 21 that are prepared are to be installed in the installation jig 40. The installation jig 40 includes a fixing plate 42, an opening member 41 having an opening 43, a pusher 46, and a lid 44. For example, one opening member 41 (first opening member) is fixed to the fixing plate 42 by fixation screws 39. The other opening member 41 (second opening member) is fixed to the fixing plate 42 by the fixation screws 39 after the semiconductor laser bar 3 and the submount bar 21 are arranged on the fixing plate 42. As shown in FIG. 13, the semiconductor laser bar 3 and the submount bar 21 are to be sequentially stacked and arranged on the fixing plate 42 such that the submount bar 21 is on the lower side with respect to the fixing plate 42. First, as shown in FIG. 11, the submount bar 21 is brought into contact with the opening member 41 and is placed on the fixing plate 42. Next, as shown in FIG. 12, the semiconductor laser bar 3 is brought into contact with the opening member 41 and placed on the submount bar 21 such that the back side electrode 15b thereof is brought into contact with the metal layer 23 of the submount bar 21. The installation of an intermediary body 34 in which the submount bar 21 and the semiconductor laser bar 3 constituting the semiconductor laser device 20 are stacked is completed. As shown in FIG. 15, a plurality of the intermediary bodies 34 is sequentially stacked on the intermediary body 34 described above. FIG. 15 shows an example in which four intermediary bodies 34 are installed in the installation jig 40. The material of the installation jig 40 including the pusher 46 is preferably stainless steel (SUS).

A method of placing the next intermediary body 34 on the lower intermediary body 34 will be described in detail. As shown in FIG. 13, the submount bar 21 is brought into contact with the opening member 41 and is placed on the semiconductor laser bar 3 such that the back side surface (the surface opposite to the metal layer 23) of the submount bar 21 is brought into contact with the front side electrode 15a of the semiconductor laser bar 3 in the intermediary body 34 of the lower layer. Next, the semiconductor laser bar 3 is brought into contact with the opening member 41 and is placed on the submount bar 21 such that the back side electrode 15b thereof is brought into contact with the metal layer 23 of the submount bar 21. FIG. 13 shows an example of three intermediary bodies 34 each in which the submount bar 21 and the semiconductor laser bar 3 are stacked are installed on the fixing plate 42 of the installation jig 40. The back side electrode 15b of the semiconductor laser bar 3 is in contact with the metal layer 23 formed on the submount bar 21. The front side electrode 15a of the semiconductor laser bar 3 is in contact with the back side surface of the submount bar 21 on which the metal layer 23 is not formed or in contact with the pusher 46, namely, the front side electrode 15a is intended not to be in contact with the metal layer 23 formed on the submount bar 21.

After a plurality of the intermediary bodies 34 is installed on the fixing plate 42, the other opening member 41 is arranged on the fixing plate 42 such that the intermediary bodies 34 each having the submount bar 21 and the semiconductor laser bar 3 are sandwiched together with the fixed opening member 41, and is temporarily fixed to the fixing plate 42 by the fixation screws 39. At this time, when both ends of the cleaved end face 14 of the semiconductor laser bar 3, namely, both ends in the longitudinal direction (both ends in the x-direction), are not arranged outside the opening 43 of the opening member 41, the arrangement is adjusted such that both ends of the cleaved end face 14 of the semiconductor laser bar 3 are outside the opening 43 of the opening member 41. Thereafter, the pusher 46 as a pressing jig is placed on the uppermost intermediary body 34, and the lid 44 is placed on the fixing plate 42 so as to cover the longitudinal end faces (end faces in the x-direction) of a plurality of the intermediary bodies 34 and the surface of the pusher 46. A bolt 48 is inserted into a hole 38 formed in the opening member 41, and the lid 44 is fixed to the two opening members 41 by a nut 49. Thereafter, the other opening member 41 which is temporarily fixed is fixed to the fixing plate 42, the fixation screw 39 is screwed into the screw hole 37 formed in the lid 44, and thus a plurality of the intermediary bodies 34 is sandwiched and fixed between the fixing plate 42 and the pusher 46.

In the jig installation step, the submount bar 21 and the semiconductor laser bar 3 that are provided in plural number are arranged on an installation jig 40 such that one cleaved end face 14 and the other cleaved end face 14 of the semiconductor laser bar 3 are exposed from the openings 43 of one opening member 41 (first opening member) and the other opening member 41 (second opening member), respectively, and the submount bar 21 and the semiconductor laser bar 3 that are provided in plural number are installed and fixed on the installation jig 40 in a state in which they are pressed against the fixing plate 42 by the pusher 46. The pressure for pressing the intermediary body 34 applied by the pusher 46 needs to be sufficient for metal bonding between the semiconductor laser bar 3 and the submount bar 21. The semiconductor laser bar 3 and the submount bar 21 are fixed in a state in which they are pressed in the installation jig 40 using the pusher 46, and then the jig installation step is completed. The pressure for pressing the intermediary bodies 34 is, for example, 70 gf cm.

The installation jig 40 in which the semiconductor laser bar 3 and the submount bar 21 that are provided in plural number are placed is installed in the end face protective film forming apparatus 60, and the bonding step of step S003 and the protective film forming step of step S004 are performed. The end face protective film forming apparatus 60 is, for example, a sputtering apparatus, a vapor deposition apparatus, a CVD apparatus, an MBE apparatus, or the like. FIG. 16 shows three intermediary bodies 34a, 34b, and 34c installed in the end face protective film forming apparatus 60. Reference numeral 34 is collectively used for the intermediary body, and 34a, 34b, and 34c are used for discrimination. Similarly, reference numeral 3 is collectively used for the semiconductor laser bar, and 3a, 3b, and 3c are used for discrimination. Reference numeral 21 is collectively used for the submount, and 21a, 21b, and 21c are used for discrimination. FIG. 16 shows a cross sectional view perpendicular to the x-direction in the three intermediary bodies 34a, 34b and 34c which each have the semiconductor laser bar 3 with the cleaved end faces 14 arranged on the right and left sides in the y-direction. The opening members 41 (not shown) are arranged on the right and left sides of the intermediary bodies 34a, 34b, and 34c, namely, on the negative and positive sides in the y-direction, and the pusher 46 (not shown) is arranged on the surface on the side in the positive z-direction of the intermediary body 34c. The intermediary body 34a has the submount bar 21a and the semiconductor laser bar 3a. Similarly, the intermediary body 34b has the submount bar 21b and the semiconductor laser bar 3b, and the intermediary body 34c has the submount bar 21c and the semiconductor laser bar 3c.

After the installation jig 40 in which the semiconductor laser bar 3 and the submount bar 21 that are provided in plural number are placed is installed in the end face protective film forming apparatus 60, it is preferable to make the inside of the end face protective film forming apparatus 60 vacuum in order to prevent oxidation of the cleaved end faces 14 of the semiconductor laser bar 3 and to prevent adhesion of an impurity such as carbon (C). Thereafter, the temperature inside the end face protective film forming apparatus 60, that is, inside the protective film forming chamber (main chamber), is raised, and the metal layer 23 formed on the submount bar 21 and the back side electrode 15b of the semiconductor laser bar 3 are bonded as shown in FIG. 17. In the case where the surface of the back side electrode 15b of the semiconductor laser bar 3 is gold and the metal layer 23 of the submount bar 21 is gold, the submount bar 21 and the semiconductor laser bar 3 are to be bonded by the gold. For example, the temperature in the metal bonding that is the temperature performed at the bonding step is 150 to 200° C. The temperature in the metal bonding preferably be less than the protective film forming temperature for forming the protective film 19, and be the temperature at which the metal layer 23 of the submount bar 21 is bonded to the surface metal of the back side electrode 15b of the semiconductor laser bar 3. In the intermediary body 34 in which the semiconductor laser bar 3 and the submount bar 21 are bonded, that is, in the intermediary body 34 for which bonding step is completed, a metal bonding portion 61 in which the metal layer 23 of the submount bar 21 and the back side electrode 15b of the semiconductor laser bar 3 are bonded is formed. Note that, FIG. 17 shows a state in which there are small gaps between the intermediary bodies adjacent to each other due to thermal expansion of the three intermediary bodies 34a, 34b, and 34c. In FIG. 17, the end face protective film forming apparatus 60 is omitted, and the gaps are exaggerated. Also, in FIGS. 18 and 19, the end face protective film forming apparatus 60 is omitted, and the gaps are exaggerated.

Next, as shown in FIG. 18, after the bonding step, the temperature inside the end face protective film forming apparatus 60 is changed to the protective film forming temperature, and protective film particles 8 are adhered to one of the cleaved end faces 14 of the semiconductor laser bar 3 from the opening 43 of the opening member 41 to form the protective film 19. The protective film 19 consists of, for example, an oxide film such as $Al_2O_3$ or $SiO_2$ or a nitride film such as SiN or the like. When the protective film is formed, the protective film forming temperature is set higher than the room temperature in order to control a composition of the protective film 19 and improve the film quality thereof. For example, the protective film forming temperature is 100 to 150° C.

After the protective film 19 is formed on one of the cleaved end faces 14, as shown in FIG. 19, the installation jig 40 is rotated by 180 degrees by a rotating mechanism (not shown) of the end face protective film forming apparatus 60, and the protective film 19 is formed by adhering the protective film particles 8 to the other side of the cleaved end faces 14. That is, in the protective film forming step, after the protective film 19 is formed on one of the cleaved end faces 14 of the semiconductor laser bar 3, the orientation of the installation jig 40 is changed so that the protective film particles 8 which are material particles of the protective film 19 reach the other of the cleaved end faces 14 of the semiconductor laser bar 3 without disassembling the installation jig 40, and thus the protective film 19 is formed on the other of the cleaved end faces 14 of the semiconductor laser bar 3. FIGS. 18 and 19 show an example in which the protective film particles 8 advance from right to left. In addition, three intermediary bodies 34a, 34b, and 34c are shown in which small gaps are formed between the intermediary bodies adjacent to each other due to thermal expansion thereof. At this time, since the back side surface of the submount bar 21 and the front side electrode 15a of the semiconductor laser bar 3 are uneven, the installation jig 40 restricts the movement of the intermediary bodies 34a, 34b, 34c in the x-direction, the y-direction, and the z-direction with the pusher 46 pushing them, there is very little possibility that the gap is extended from the cleaved end face 14 on the upstream side (positive side in the y-direction) to the cleaved end face 14 on the downstream side (negative side in the y-direction), which is the direction the protective film particles 8 advance.

The rotating mechanism may be provided in a sub-chamber provided in the end face protective film forming apparatus 60. In this case, after the installation jig 40 is once returned to the sub-chamber and inverted and then installed again in the end face protective film forming apparatus 60, the protective film 19 is formed. In the case where the rotating mechanism is installed in the main chamber where the protective film 19 is to be formed or the sub-chamber in the end face protective film forming apparatus 60, the installation jig 40 is not exposed to the atmosphere, so that the natural oxide film to be formed on the cleaved end faces 14 can be significantly reduced. When the end face protective film forming apparatus 60 has no rotating mechanism, after the protective film 19 is formed on one of the cleaved end faces 14, the installation jig 40 is taken out from the end face protective film forming apparatus 60 and is inverted by a conveying apparatus or the like, and after the installation jig 40 is installed again in the end face protective film forming apparatus 60, the protective film 19 is to be formed on the other of the cleaved end faces 14. Even when the end face protective film forming apparatus 60 is taken out during the protective film forming step, the amount of the natural oxide film to be formed on the cleaved end faces 14 can be reduced as compared with the end face protective film forming method of Patent Document 1 in which the protective film is to be formed on the cleaved end faces after the steps of die bonding to the submount, wire bonding, and heat resistant sheet covering, after the cleaved end faces are formed on the semiconductor lasers.

Note that, an example is described in which the installation jig 40 is inverted, namely, it is rotated by 180 degrees, but 180 degrees is not a limitation. In the case where the source of the protective film particles 8 to form the protective film 19 is only one, the cleaved end face 14 needs to face the source of the protective film particles 8, and for example, the angle between a perpendicular line perpendicular to the cleaved end face 14 and the line connecting the source and the center of the cleaved end face 14 in the longitudinal direction needs to be within 30 degrees. In the case where the protective film particles 8 are generated from two sources, the opening 43 of the installation jig 40 from which the cleaved end face 14 without the protective film 19 formed are exposed is directed toward the other source.

In general, when a semiconductor laser bar is fixed to a jig as shown in FIG. 5 of Patent Document 1, a spacer is inserted between the semiconductor laser bars. During the protective film formation, a gap is generated between the semiconductor laser bar and the spacer due to the difference in thermal expansion coefficients of the semiconductor laser bar, the spacer, and the like as a result of the temperature rise at the protective film formation, and the protective film particles enter the gap and adhere to the electrode surface of the semiconductor laser bar. However, in the formation of the semiconductor laser end face protective film of Embodiment 1, even if the temperature of the portion where the metal bonding portion 61 is formed rises to the temperature of the formation of the protective film, the metal bonding portion 61 is already formed and no gap is generated between the semiconductor laser bar 3 and the submount bar 21 that are bonded. Therefore, the protective film particles 8 cannot adhere to each of the surfaces where the metal layer 23 of the submount bar 21 and the back side electrode 15*b* of the semiconductor laser bar 3 are bonded.

In general, the semiconductor laser bar and the submount bar are bonded with solder which is a brazing material. However, in the formation of the semiconductor laser end face protective film of Embodiment 1, the metal layer 23 of the submount bar 21 and the back side electrode 15*b* of the semiconductor laser bar 33 are metal-bonded without using solder. In the case where the semiconductor laser device 20 of Embodiment 1 is bonded with gold, that is, in the case where the metal layer 23 of the submount bar 21 is gold, the surface of the back side electrode 15*b* of the semiconductor laser bar 33 is gold, and the metal bonding portion 61 is a gold bonding portion. Since the thermal conductivity of gold is higher than that of solder, heat generated by driving the semiconductor laser bar can be efficiently discharged to the submount bar 21. Here, the thermal conductivity of gold (Au) is 315 w/m·K and that of gold-tin (AuSn) solder is 57 w/m·K.

Although the example is described in which the bonding step is performed in the end face protective film forming apparatus 60, the bonding step may be performed in another apparatus. However, it is more efficient in terms of workability and cost to perform the bonding step in the end face protective film forming apparatus 60.

Next to the protective film forming step of step S004, a semiconductor laser device unloading step of step S005 is performed. An installation jig 40 is taken out from the end face protective film forming apparatus 60, and the semiconductor laser device 20 having the semiconductor laser bar 33 with the protective film 19 formed on the cleaved end faces 14 is individually taken out from the installation jig 40. Thereafter, a block mounting step of step S006 is performed. Solder or the like is supplied to the back side surface of the submount bar 21 of the semiconductor laser device 20, and the semiconductor laser device 20 is mounted on the block 51. The semiconductor laser device 20 is bonded to the metal layer 53 of the block 51 with a brazing material such as the solder 24. Note that, the semiconductor laser device 20 may be mounted on the block 51 after supplying the brazing material such as the solder 24 to the metal layer 53 of the block 51.

In the end face protective film forming method for the semiconductor laser of Embodiment 1, the semiconductor laser bar 3 and the submount bar 21 are metal-bonded before the protective film 19 is formed on the cleaved end faces 14 of the semiconductor laser bar 3, so that no gap is generated between the metal layer 23 of the submount bar 21 and the back side electrode 15*b* of the semiconductor laser bar 3 when the protective film 19 is formed, and therefore, the protective film particles 8 do not adhere to each of the surfaces where the metal layer 23 of the submount bar 21 and the back side electrode 15*b* of the semiconductor laser bar 3 are bonded. In the semiconductor laser device 20 and the semiconductor device 50 of Embodiment 1, since the protective film particles 8 do not adhere to each of the surfaces where the metal layer 23 of the submount bar 21 and the back side electrode 15*b* of the semiconductor laser bar 3 are bonded, the heat generated by the driving of the semiconductor laser device 20 and the semiconductor device 50 can be efficiently discharged to the submount bar 21, and the element degradation caused by the end face, such as the COD degradation, can be suppressed.

In the end face protective film forming method for the semiconductor laser of Embodiment 1, the bonding step in which the semiconductor laser bar 3 and the submount bar 21 are metal-bonded and the protective film forming step in which the protective film 19 is formed on the cleaved end faces 14 of the semiconductor laser bar 3 can be performed in the same apparatus, and the steps from the forming of the cleaved end faces 14 of the semiconductor laser bar 3 using cleavage technique up to the forming of the protective film 19 can be performed in several hours. Therefore, in the end face protective film forming method for the semiconductor laser of Embodiment 1, since the time during which the cleaved end faces 14 of the semiconductor laser bar 3 is exposed to the atmosphere is short, the natural oxide film on the cleaved end faces 14 of the semiconductor laser bar 3, which is one of the causes of the degradation of the semiconductor laser device 20 and the semiconductor device 50, can be reduced as compared with the conventional method.

In the protective film forming method shown in FIG. 3 of Patent Document 1, since a semiconductor laser chip is fixed and mounted on a submount, and the semiconductor laser and the submount are connected by a wire and then installed in a jig (installation jig) used for forming the protective film, it is necessary to protect the electrode surface of the submount with a heat resistant sheet, and thus a problem arises in that the work steps are complicated and the workability is poor. In contrast, in the end face protective film forming method for the semiconductor laser of Embodiment 1, the jig installation step of step S002, the bonding step of step S003, and the protective film forming step of step S004 can be performed using the bar-shaped semiconductor laser bar 3 and the submount bar 21. In the semiconductor device manufacturing method of Embodiment 1, after the step of the end face protective film forming method for the semiconductor laser, the semiconductor laser device unloading step of step S005 and the block mounting step of step S006 can be performed using the semiconductor laser bar 3 and the submount bar 21 that are bonded. That is, in the end face protective film forming method for a semiconductor laser of Embodiment 1, the semiconductor laser bar 3 and the submount bar 21 can be installed in the installation jig 40 in a short time without performing the die bonding step, the wire bonding step, and the heat-resistant sheet covering step in the protective film forming method shown in FIG. 3 of Patent Document 1, and thereafter, with the semiconductor laser bar 3 and the submount bar 21 kept installed in the installation jig 40, they can be bonded in the bonding step and the protective film forming step of the semiconductor laser bar 3 can be performed. Therefore, the end face protective film forming method for the semiconductor laser of Embodiment 1 is superior in the workability to the protective film forming method shown in FIG. 3 of Patent Document 1.

In the semiconductor laser device 20 and the semiconductor device 50 of Embodiment 1, since the back side electrode 15b of the semiconductor laser bar 3 and the metal layer 23 of the submount bar 21 each have a metal surface on which no pattern is formed, the bonding area between the back side electrode 15b of the semiconductor laser bar 3 and the metal layer 23 of the submount bar 21 can be made wide, and the heat dissipation from the semiconductor laser bar 3 to the submount bar 21 can be enhanced.

Since the semiconductor device manufacturing method and the semiconductor laser device manufacturing method of Embodiment 1 include the end face protective film forming method for the semiconductor laser of Embodiment 1, the same effects as those of the end face protective film forming method for the semiconductor laser of Embodiment 1 are obtained. In the semiconductor laser device 20 of Embodiment 1, since the protective film 19 is formed on the cleaved end faces 14 of the semiconductor laser bar 3 with the natural oxide film reduced, it is possible to suppress the element degradation caused by the end face, such as COD degradation. Further, in the semiconductor laser device 20 of Embodiment 1, since the protective film particles 8 do not adhere between the back side electrode 15b of the semiconductor laser bar 3 and the metal layer 23 of the submount bar 21, heat generated by driving the semiconductor laser device 20 can be efficiently discharged to the submount bar 21, and element degradation caused by the end surface, such as COD degradation, can be suppressed. Since the semiconductor device 50 of Embodiment 1 includes the semiconductor laser device 20 of Embodiment 1, the same effects as those of the semiconductor laser device 20 of Embodiment 1 can be obtained.

As described above, the semiconductor laser device manufacturing method of Embodiment 1 is a method of manufacturing the semiconductor laser device in which the protective film 19 is formed on the cleaved end faces 14 of the semiconductor laser bar 3 which is the bar-shaped semiconductor laser. In the semiconductor laser bar 3, the front side electrode 15a is formed on one surface different from the cleaved end faces 14, and the back side electrode 15b is formed on the surface opposite to the one surface. The method includes: the material preparation step of forming the metal layer 23 on the front side surface of the bar-shaped submount bar body 22 which is to face the semiconductor laser bar 3, to prepare the bar-shaped submount bar 21 on which the semiconductor laser bar 3 is to be mounted; the jig installation step of installing the submount bar 21 and the semiconductor laser bar 3 that are provided in plural number alternately stacked on the installation jig 40 such that the metal layer 23 of the submount bar 21 and the back side electrode 15b of the semiconductor laser bar 3 face each other; the bonding step of bonding the metal layer 23 and the back side electrode 15b by increasing the temperature of the installation jig 40 on which the submount bar 21 and the semiconductor laser bar 3 that are provided in plural number are installed; and the protective film forming step of forming the protective film 19 on the cleaved end faces 14 of the semiconductor laser bar 3 in the protective film forming apparatus (end face protective film forming apparatus 60) using the installation jig 40 in which the submount bar 21 and the semiconductor laser bar 3 that are provided in plural number are installed, after the bonding step. In the end face protective film forming method for the semiconductor laser of Embodiment 1, the submount bar 21 and the semiconductor laser bar 3 that are provided in plural number are alternately stacked and installed on the installation jig 40, and after the metal layer 23 of the submount bar 21 and the back side electrode 15b of the semiconductor laser bar 3 are bonded, the protective film 19 is formed on the cleaved end faces 14 of the semiconductor laser bar 3, so that, when the protective film is formed on the cleaved end faces 14 of the semiconductor laser (semiconductor laser bar 3), adhesion of the protective film 19 to the electrode surface (surface of the back side electrode 15b) of the semiconductor laser (semiconductor laser bar 3) on the side where the submount (submount bar 21) is bonded can be prevented, and the protective film 19 can be formed on the cleaved end faces 14 of the semiconductor laser (semiconductor laser bar 3) in which the natural oxide film is reduced more than in the conventional method.

Embodiment 2

Figure 20:
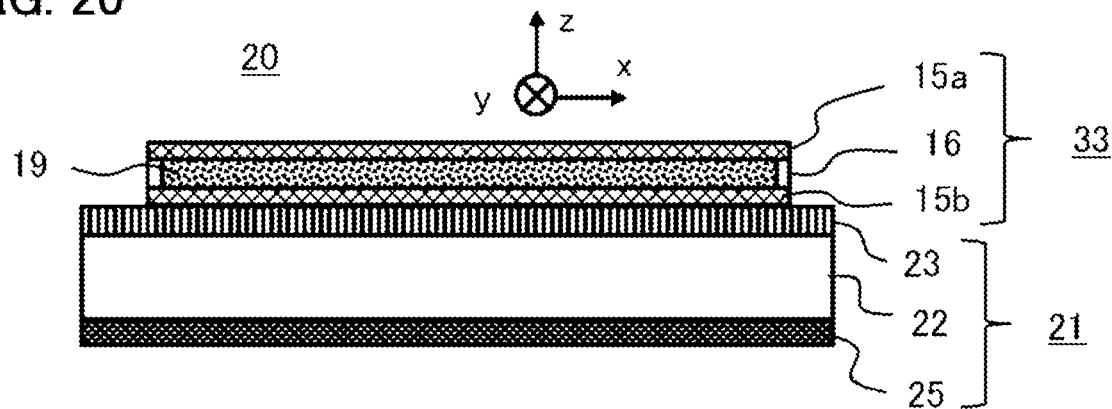
FIG. 20 is a diagram showing a semiconductor laser device according to Embodiment 2.
Figure 21:
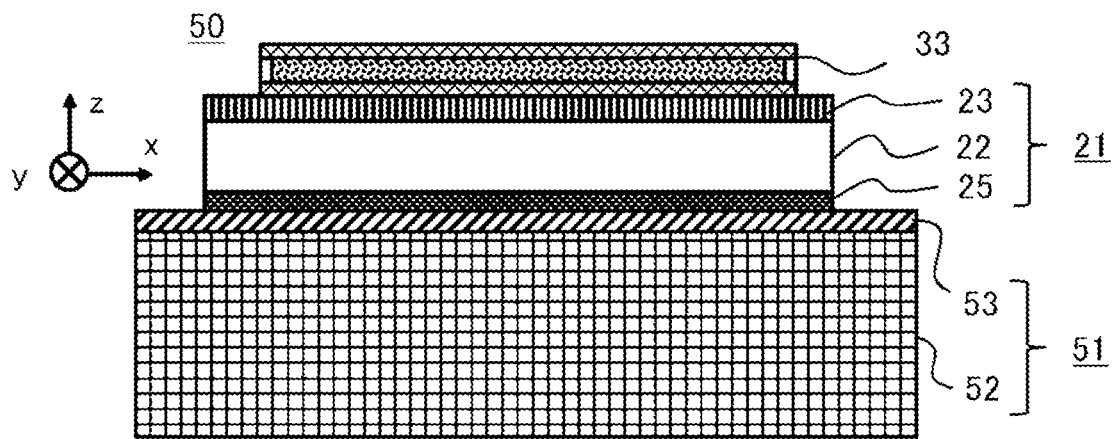
FIG. 21 is a diagram showing a semiconductor device according to Embodiment 2.
Figure 22:
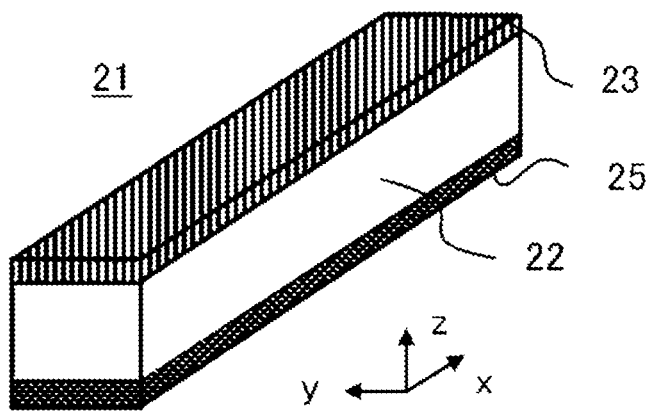
FIG. 22 is a bird's eye view of a submount bar of FIG. 20.
Figure 23:
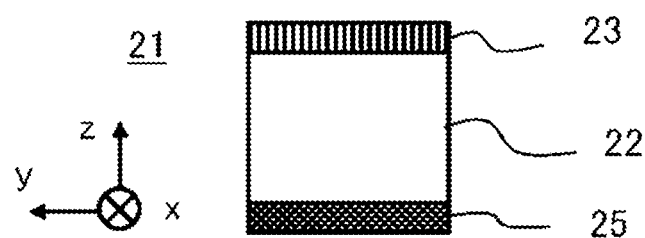
FIG. 23 is a cross sectional view of the submount bar of FIG. 22 perpendicular to the x-direction.
Figure 24:
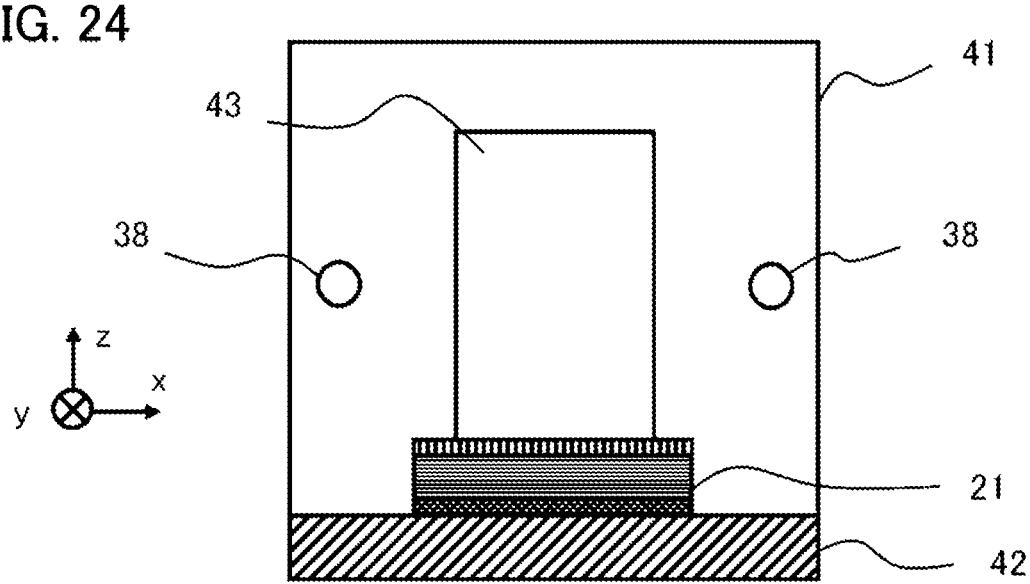
FIG. 24 is a diagram illustrating a method of installing the semiconductor laser bar and the submount bar of FIG. 22 in the installation jig.
Figure 25:
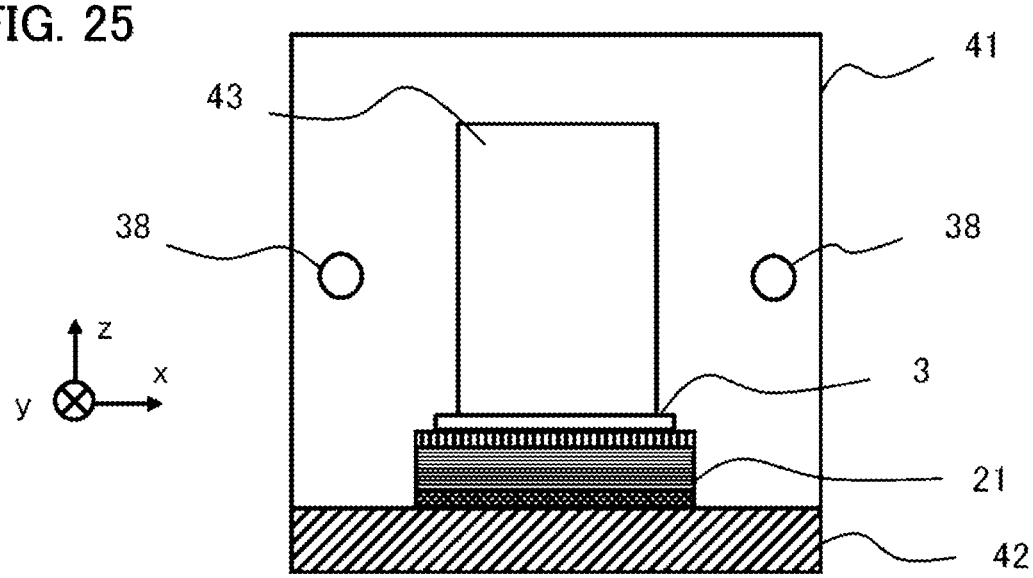
FIG. 25 is a diagram illustrating the method of installing the semiconductor laser bar and the submount bar of FIG. 22 in the installation jig.
Figure 26:
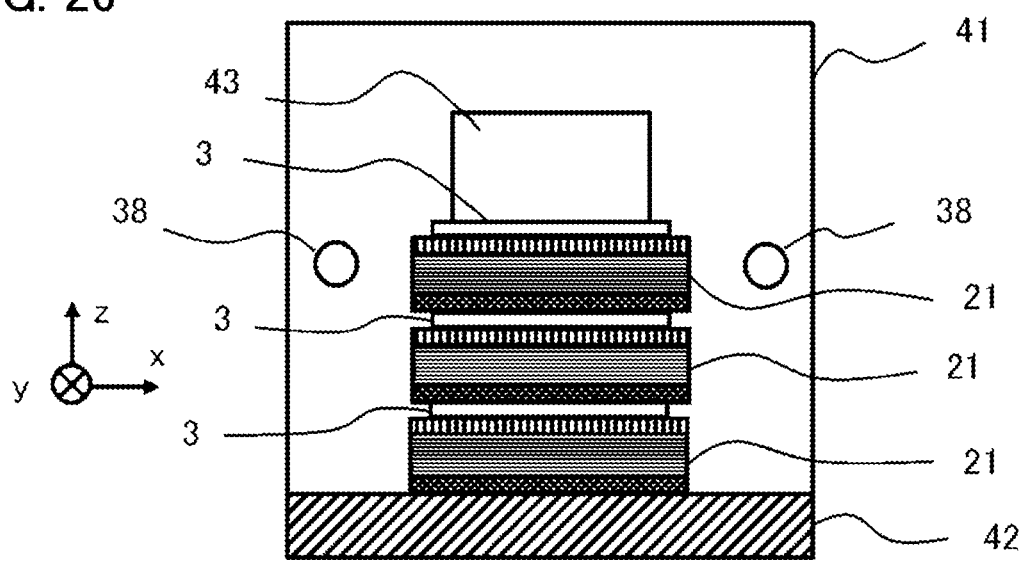
FIG. 26 is a diagram illustrating the method of installing the semiconductor laser bar and the submount bar of FIG. 22 in the installation jig.
Figure 27:
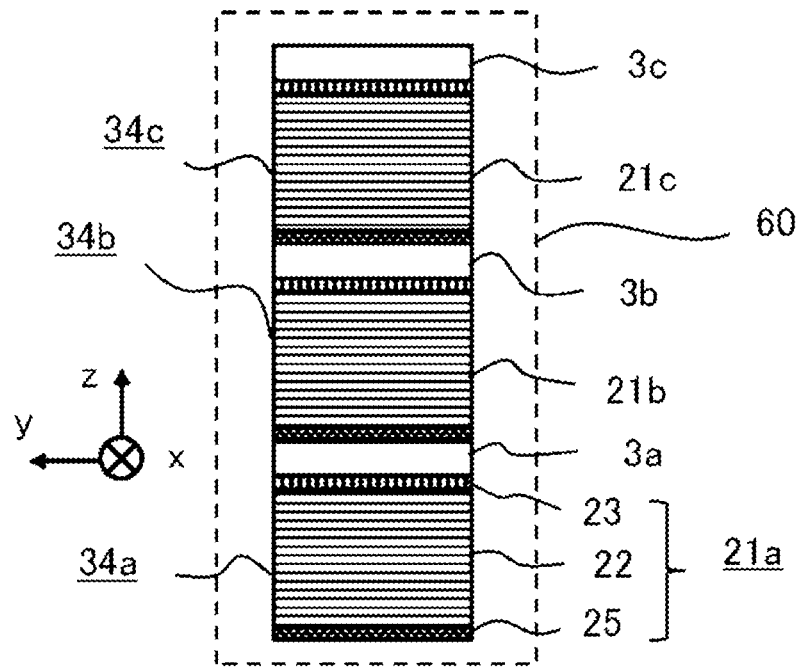
FIG. 27 is a diagram illustrating a bonding step according to Embodiment 2.
Figure 28:
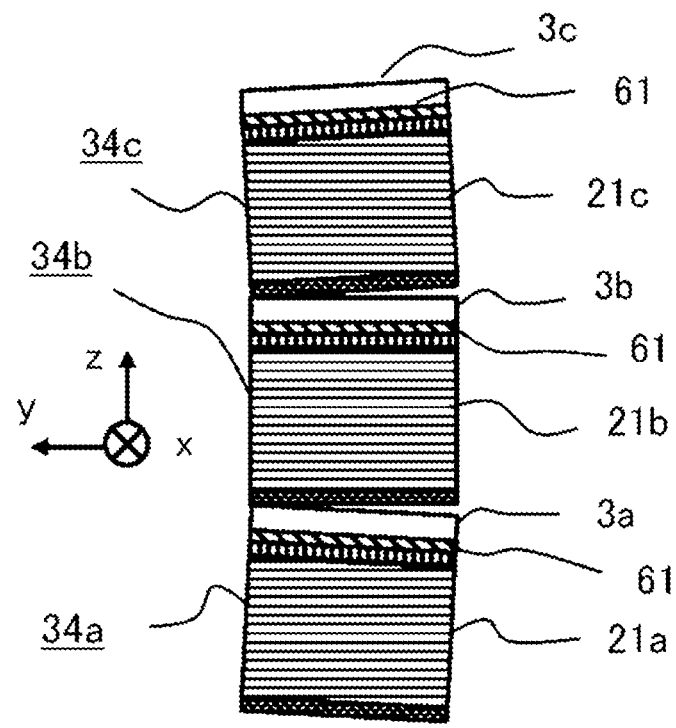
FIG. 28 is a diagram illustrating a bonding step according to Embodiment 2.
Figure 29:
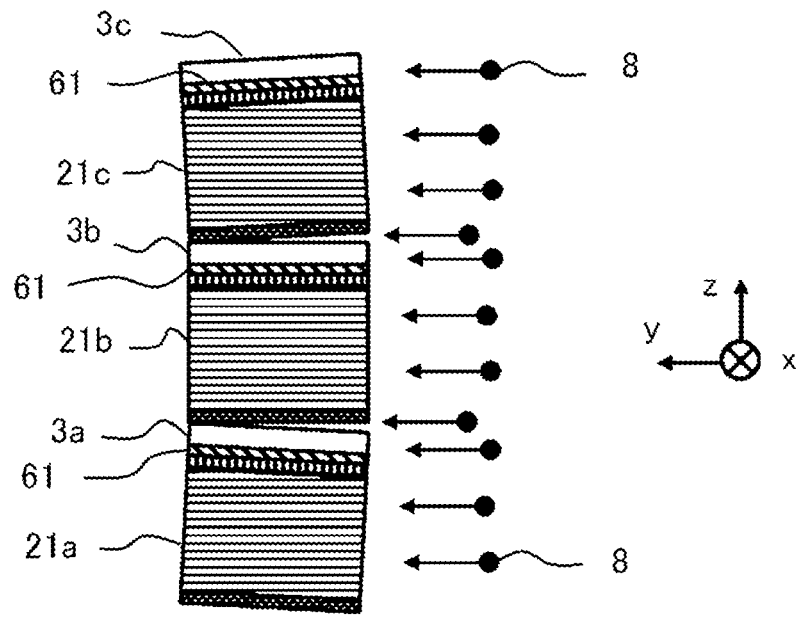
FIG. 29 is a diagram illustrating a protective film forming step according to Embodiment 2.
Figure 30:
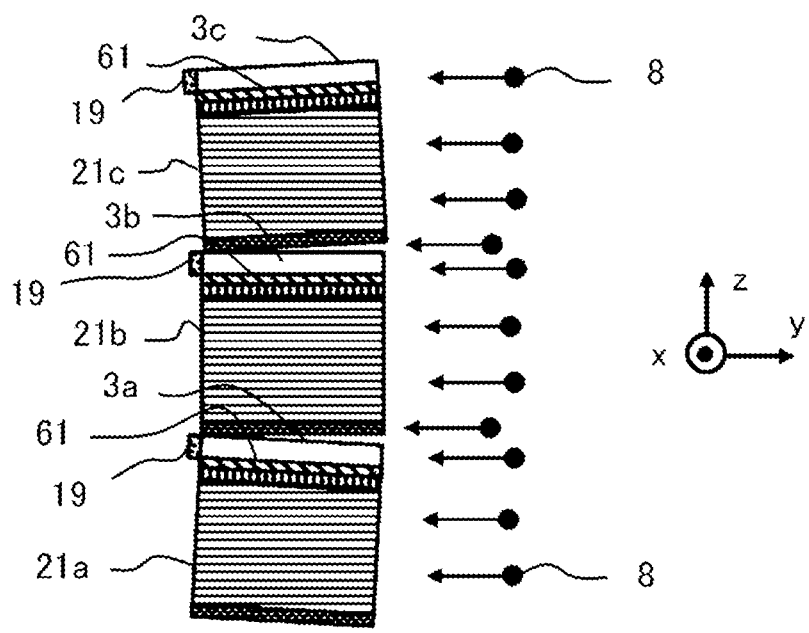
FIG. 30 is a diagram illustrating a protective film forming step according to Embodiment 2.

FIG. 20 is a diagram showing a semiconductor laser device according to Embodiment 2 and FIG. 21 is a diagram showing a semiconductor device according to Embodiment 2. FIG. 22 is a bird's eye view of a submount bar of FIG. 20 and FIG. 23 is a cross sectional view of the submount bar of FIG. 22 perpendicular to the x-direction. FIGS. 24, 25, and 26 each are diagrams illustrating a method of installing the semiconductor laser bar and the submount bar of FIG. 22 in the installation jig. FIGS. 27 and 28 each are diagrams illustrating a bonding step according to Embodiment 2. FIGS. 29 and 30 each are diagrams illustrating a protective film forming step according to Embodiment 2. The semiconductor laser device 20 and the semiconductor device 50 of Embodiment 2 are different from the semiconductor laser device 20 and the semiconductor device 50 of Embodiment 1 in that solder 25 is formed on the back side surface of the submount bar body 22 in the submount bar 21. Portions different from Embodiment 1 will be mainly described. In FIGS. 28, 29, and 30, the end face protective film forming apparatus 60 is omitted, and gaps are exaggerated.

In the material preparation step of step S001, the submount bar 21 having the solder 25 formed on the back side surface of the submount bar body 22 is prepared. In the submount bar preparation step in the material preparation step, the submount bar body 22 which is a plate like semiconductor substrate such as AlN or SiC separated in a bar shape is produced, and the metal layer 23 is formed on a surface (front side surface) to which the back side electrode 15b of the semiconductor laser bar 3 is to be bonded, using a vapor deposition apparatus, a sputtering apparatus, plating technique or the like. Next, the solder 25 made of tin-copper (SnCu), tin-silver-copper (SnAgCu) or the like is formed on the back side surface which is on the side opposite to the metal layer 23 of the submount bar body 22, using a vapor deposition apparatus, a sputtering apparatus or the like.

Here, the solder 25 to be formed on the submount bar body 22 needs to be selected from a material that does not melt at the processing temperature of the bonding step of step S003. For example, the melting point of the SnCu solder is 230° C. For example, in the case where the outermost surface metal of the films that make up the front side electrode 15a and the back side electrode 15b is gold and the metal layer 23 is gold, the submount bar 21 and the semiconductor laser bar 3 are gold-bonded. When the processing temperature at which the submount bar 21 and the semiconductor laser bar 3 are gold-bonded is 150 to 200° C., the solder 25 made of SnCu, SnAgCu or the like does not melt. For example, the melting point of SAgCu is 219° C. Further, since gold is not contained in the solder 25, the solder 25 cannot be bonded to the front side electrode 15a of the semiconductor laser bar 3. The front side electrode 15a of the semiconductor laser bar 3b in the intermediary body 34b under the intermediary body 34c cannot be bonded to the solder 25 of the submount bar 21c in the intermediary body 34c. That is, the front side electrode 15a of the semiconductor laser bar 3 in one intermediary body 34 under another intermediary body 34 cannot be bonded to the solder 25 of the submount bar 21 in the another intermediary body 34.

The laser bar preparation step in the material preparation step, the jig installation step of step S002, the bonding step of step S003, the protective film forming step of step S004, and the semiconductor laser device unloading step of step S005 are the same as those in Embodiment 1. Note that, in the jig installation step of step S002, the back side electrode 15b of the semiconductor laser bar 3 is brought into contact with the metal layer 23 formed on the submount bar 21 as shown in FIG. 26. Further, the front side electrode 15a of the semiconductor laser bar 3 is in contact with the solder 25 of the back side surface of the submount bar 21, and thus does not come into contact with the metal layer 23 formed on the submount bar 21.

The block mounting step of step S006 is different from that in Embodiment 1. In the semiconductor laser device 20 in which the steps up to the semiconductor laser device unloading step of step S005 is carried out, in the block mounting step of step S006, since the solder 25 is formed on the back side surface of the submount bar 21, the semiconductor laser device 20 is mounted on the block 51 while the solder 25 is melted. When the solder 25 is cooled and solidified, the semiconductor laser device 20 is fixed to the block 51. The solder 25 can be melted, for example, by a soldering gun, etc. or by heating the block 51 to the temperature higher than the melting temperature of the solder 25.

In the end face protective film forming method for the semiconductor laser of Embodiment 2, the semiconductor laser bar 3 and the submount bar 21 are metal-bonded before the protective film 19 is formed on the cleaved end faces 14 of the semiconductor laser bar 3, and the bonding step and the protective film forming step can be carried out in the same apparatus, and the same effects as in the end face protective film forming method for the semiconductor laser of Embodiment 1 can be obtained. In the semiconductor device manufacturing method according to Embodiment 2, a brazing material such as the solder 25 necessary for the block mounting step is formed on the back side surface of the submount bar 21 which is not bonded to the semiconductor laser bar 3, so that it is not necessary to separately supply solder or the like, and the work efficiency is improved as compared with the semiconductor device manufacturing method of Embodiment 1.

Since the semiconductor device manufacturing method and the semiconductor laser device manufacturing method of Embodiment 2 include the end face protective film forming method for the semiconductor laser of Embodiment 2, the same effects as those of the end face protective film forming method for the semiconductor laser of Embodiment 2 are obtained. The semiconductor laser device 20 of Embodiment 2 has the same structure as that of the semiconductor laser device 20 of Embodiment 1 except that the solder 25 is formed on the back side surface of the submount bar 21, so that the same effects as those of the semiconductor laser device 20 of Embodiment 1 are obtained. Since the semiconductor device 50 of Embodiment 2 includes the semiconductor laser device 20 of Embodiment 2, the same effects as those of the semiconductor laser device 20 of Embodiment 2 are obtained.

Embodiment 3

Figure 31:
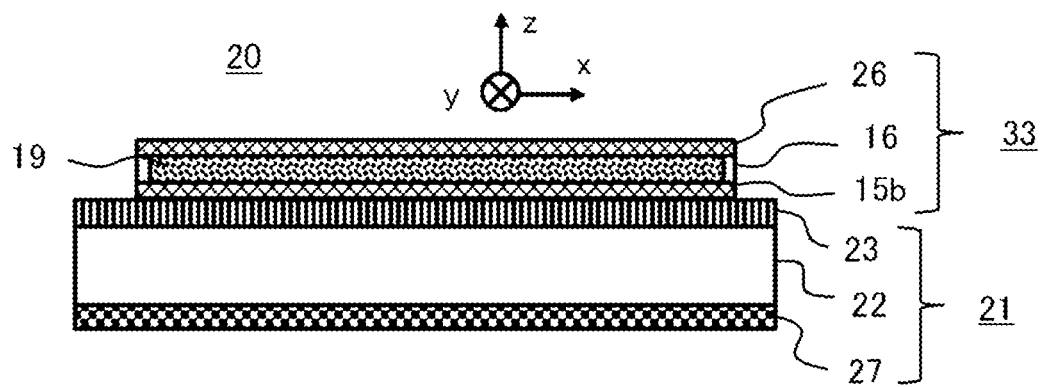
FIG. 31 is a diagram showing a semiconductor laser device according to Embodiment 3.
Figure 32:
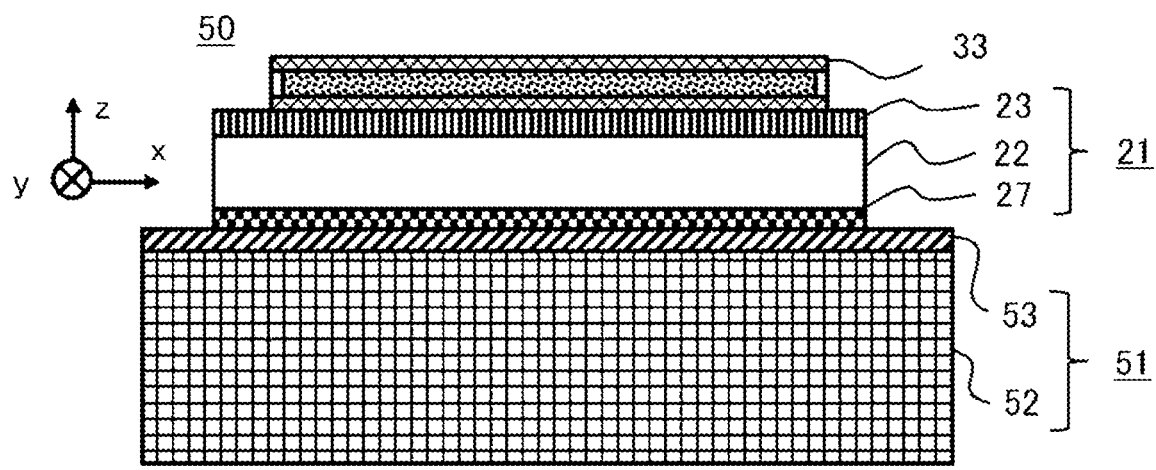
FIG. 32 is a diagram showing a semiconductor device according to Embodiment 3.
Figure 33:
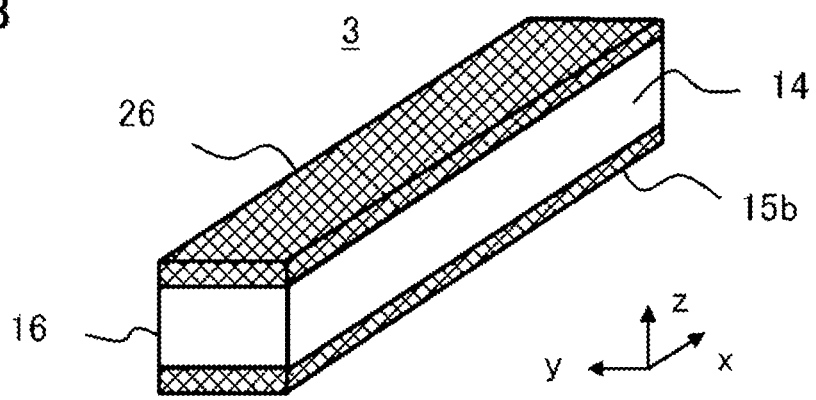
FIG. 33 is a bird's eye view of a semiconductor laser bar according to Embodiment 3.
Figure 34:
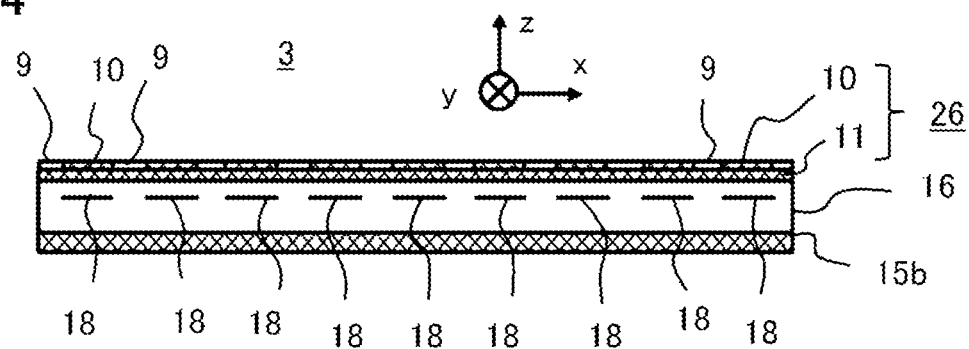
FIG. 34 is a cross sectional view of the semiconductor laser bar of FIG. 33 perpendicular to the y-direction.
Figure 35:
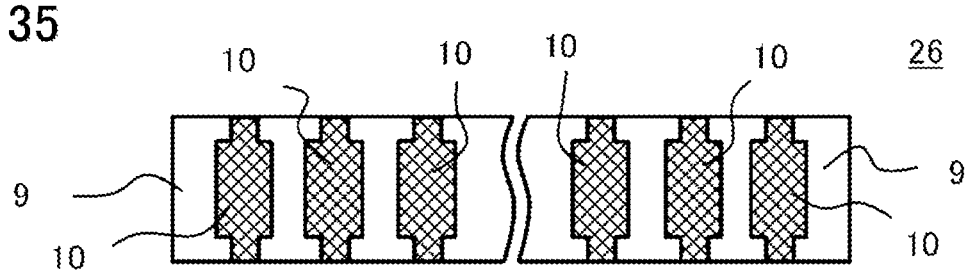
FIG. 35 is a diagram showing a surface electrode layer of FIG. 34.
Figure 36:
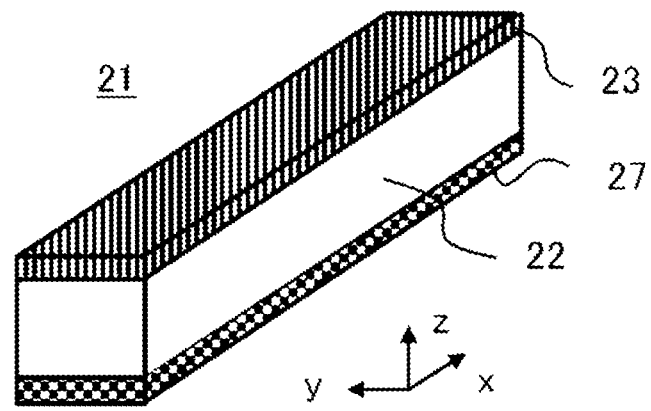
FIG. 36 is a bird's eye view of a submount bar of FIG. 31.
Figure 37:
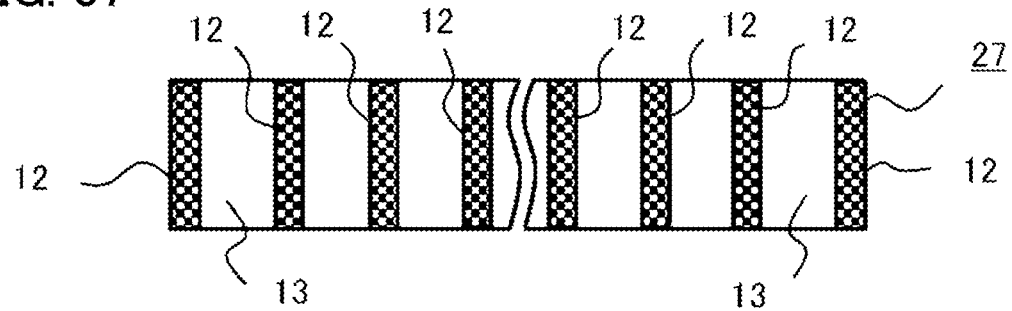
FIG. 37 is a diagram showing a metal layer on the back side surface of the submount bar of FIG. 36.

FIG. 31 is a diagram showing a semiconductor laser device according to Embodiment 3 and FIG. 32 is a diagram showing a semiconductor device according to Embodiment 3. FIG. 33 is a bird's eye view of a semiconductor laser bar according to Embodiment 3 and FIG. 34 is a cross sectional view of the semiconductor laser bar of FIG. 33 perpendicular to the y-direction. FIG. 35 is a diagram showing a surface electrode layer of FIG. 34. FIG. 36 is a bird's eye view of the submount bar of FIG. 31 and FIG. 37 is a diagram showing a metal layer on the back side surface of the submount bar of FIG. 36. The semiconductor laser device 20 and the semiconductor device 50 of Embodiment 3 are different from the semiconductor laser device 20 and the semiconductor device 50 of Embodiment 2 in that the front side electrode of the semiconductor laser bar 33 is a patterned front side electrode 26 and a patterned metal layer 27 is formed on the back side surface of the submount bar 21. Portions different from Embodiments 1 and 2 will be mainly described.

In general, the front side electrode 15a and the back side electrode 15b in the semiconductor laser bar 33 provided with a plurality of the light emitting regions 18 are patterned for the purpose of efficient separation into a single semiconductor laser provided with one light emitting region 18 and for the purpose of recognizing the positions of the light emitting regions, etc. As shown in FIGS. 34 and 35, the semiconductor laser bar 33 of Embodiment 3 includes the front side electrode 26 having a first electrode layer 11 and a patterned second electrode layer 10 formed on the surface of the first electrode layer 11, and the back side electrode 15b that is not patterned. The second electrode layer 10 is a separated electrode layer that is the layer of the surface far from the back side electrode 15b, and it is separated for each of the light emitting regions 18. The first electrode layer 11 has a layered structure of, for example, Ti/Pt, and the second electrode layer 10 is gold. The back side electrode 15b is only gold or has a layered structure in which the outermost surface is gold. It is preferable that the outermost surface metal of the films that make up the front side electrode 15a and the back side electrode 15b be gold. An insulating film 9 is formed on the surface of the first electrode layer 11 on which the patterned second electrode layer 10 is not formed. Note that, in FIGS. 31 to 33, the insulating film 9 on the surface of the semiconductor laser bar 3 or 33 is omitted.

As shown in FIGS. 36 and 37, the submount bar 21 of Embodiment 3 includes the metal layer 23 that is not patterned and a patterned metal layer 27. The metal layer 23 is the same as that in Embodiment 1. When the outmost surface of the back side electrode 15b of the semiconductor laser bar 33 is gold, the metal layer 23 is preferably gold. The patterned metal layer 27 has a plurality of separated metal patterns 12. A non-metal region 13 is formed between the adjacent metal patterns 12. The non-metal region 13 is, for example, the exposed back side surface of the submount bar body 22. The metal layer 27 is gold or the like. Here, in the patterned metal layer 27, the metal patterns 12 are formed such that the second electrode layer 10 of the front side electrode 26 patterned on the semiconductor laser bar 3 and the metal patterns 12 of the patterned metal layer 27 on the back side surface of the submount bar 21 do not come into contact with each other when the semiconductor laser bar 3 and the submount bar 21 are installed in the installation jig 40.

The end face protective film forming method for the semiconductor laser of Embodiment 3 is different from the end face protective film forming method for the semiconductor laser of Embodiments 1 and 2 in the material preparation step. In the submount bar preparation step in the material preparation step of step S001, the patterned metal layer 27 is formed on the back side surface of the submount bar 21 that is to be bonded to the block 51, using photolithography technique, metal layer forming technique, and etching technique. The metal layer forming technique is technique of forming a metal layer using a vapor deposition apparatus, a sputtering apparatus or the like, or plating technique. The etching technique is technique of etching a part of a metal layer by dry etching or wet etching.

In the laser bar preparation step in the material preparation step of step S001, a surface electrode 26 having the first electrode layer 11 and the patterned second electrode layer 10 formed on the surface of the first electrode layer 11 is formed on the surface of the semiconductor structure part 16. The patterned second electrode layer 10 is formed using photolithography technique, metal layer forming technique, and etching technique. The jig installation step of step S002, the bonding step of step S003, the protective film forming step of step S004, and the semiconductor laser device unloading step of step S005 are the same as those in Embodiment 1. In the jig installation step of step S002, the intermediary bodies 34 are arranged such that the second electrode layer 10 of the front side electrode 26 patterned on the semiconductor laser bar 3 does not come into contact with the metal patterns 12 of the metal layer 27 patterned on the back side surface of the submount bar 21.

In the block mounting step of step S006, after the semiconductor laser device 20 is arranged in the block 51, the metal layer 27 of the semiconductor laser device 20 and the metal layer 53 of the block 51 are heated and bonded to each other to thereby fix and mount the semiconductor laser device 20 on the block 51. When both the metal layer 27 and the metal layer 53 are gold, the metal layer 27 of the semiconductor laser device 20 and the metal layer 53 of the block 51 are to be gold-bonded. For example, the heating temperature in the block mounting step is 150 to 200° C.

In the end face protective film forming method for the semiconductor laser of Embodiment 2, a case is considered in which the uppermost surface of the front side electrode 15a of the semiconductor laser bar 3 that is not patterned is gold and the metal formed on the back side surface of the submount bar 21 is changed from the solder 25 to gold that is not patterned. In this case, in the bonding step of step S003, a problem will arise in that gold bonding occurs in a portion other than the desired portion, namely, the portion between the gold on the back side surface of the submount bar 21 and the un-patterned front side electrode 15a of the semiconductor laser bar 3 of another intermediate body 34, and thus the intermediary bodies 34 cannot be separated in the semiconductor laser device unloading step of step S005 owing to the intermediary bodies 34 bonded to each other after the protective film forming step of step S004. However, as in the semiconductor laser end surface protective film forming method of Embodiment 3, when the front side electrode of the semiconductor laser bar 3 or 33 is the patterned front side electrode 26 and the patterned metal layer 27 is formed on the back side surface of the submount bar 21, the semiconductor laser device 20 having the semiconductor laser bar 33 with the protective film 19 formed on the cleaved end faces 14 can be individually taken out from the installation jig 40.

In the end face protective film forming method for the semiconductor laser of Embodiment 3, the front side electrode of the semiconductor laser bar 3 is the patterned front side electrode 26, and the patterned metal layer 27 is formed on the back side surface of the submount bar 21, and in the jig installation step of step S002, the intermediary bodies 34 are arranged such that the second electrode layer 10 of the patterned front side electrode 26 in the semiconductor laser bar 3 and the metal patterns 12 of the patterned metal layer 27 on the back side surface of the submount bar 21 do not come into contact with each other. Therefore, in the bonding step of step S003, the metal bonding portion 61 by the gold bonding or the like can be formed only in the desired portion, namely, the portion between the back side electrode 15b of the semiconductor laser bar 3 and the metal layer 23 of the submount bar 21, and the metal bonding portion by the gold bonding or the like is not formed in the other portion.

In the end face protective film forming method for the semiconductor laser of Embodiment 3, the semiconductor laser bar 3 and the submount bar 21 are metal-bonded before the protective film 19 is formed on the cleaved end faces 14 of the semiconductor laser bar 3, and the bonding step and the protective film forming step can be performed in the same apparatus, and thus the same effects as in the end face protective film forming method for the semiconductor laser of Embodiment 1 can be obtained. The semiconductor device manufacturing method of Embodiment 3 is different from the method of manufacturing the semiconductor device of Embodiment 2 in that the semiconductor laser device 20 and the block 51 can be mounted in the block mounting step of step S006 using the gold bonding. Since gold has a higher thermal conductivity than solder, heat dissipation between the submount bar 21 and the block 51 can be improved. In the semiconductor device manufacturing method of Embodiment 3, since the semiconductor laser device 20 can be mounted on the block 51 using the gold bonding, heat dissipation between the semiconductor laser device 20 and the block 51 can be improved as compared with the semiconductor device manufacturing method of Embodiment 2. Therefore, the semiconductor device 50 of Embodiment 3 can improve heat dissipation between the semiconductor laser device 20 and the block 51 as compared with the semiconductor device 50 of Embodiment 2. Note that, although the bonding area between the patterned metal layer 27 of the semiconductor laser device 20 and the metal layer 53 of the block 51 is smaller than the bonding area between the solder 25 of the semiconductor laser device 20 and the metal layer 53 of the block 51 in the semiconductor device 50 of Embodiment 2, there is no problem in the heat dissipation because the distance from the semiconductor laser bar 3 to the block 51 corresponds to the thickness of the submount bar 21.

Since the semiconductor device manufacturing method and the semiconductor laser device manufacturing method of Embodiment 3 include the end face protective film forming method for the semiconductor laser of Embodiment 3, the same effects as those of the end face protective film forming method for the semiconductor laser of Embodiment 3 are obtained. Since the semiconductor laser device 20 of Embodiment 3 has the same structure as that of the semiconductor laser device 20 of Embodiment 1 except that the patterned metal layer 27 is formed on the back side surface of the submount bar 21 and the patterned front side electrode 26 is formed on the front side surface of the semiconductor laser bar 33, the same effects as those of the semiconductor laser device 20 of Embodiment 1 are obtained. Since the semiconductor device 50 of Embodiment 3 includes the semiconductor laser device 20 of Embodiment 3, the same effects as those of the semiconductor laser device 20 of Embodiment 3 are obtained.

Note that, although the semiconductor laser device 20 is described as having a plurality of the light emitting regions 18, the semiconductor laser device 20 may be separated into each of the light emitting regions 18. That is, after the semiconductor laser device unloading step of step S005, the semiconductor laser device 20, that is, the semiconductor laser bar 33 and the submount bar 21, may be cut for each of the light emitting regions 18 to manufacture the semiconductor laser device 20 in a small piece having a single light emitting region 18. Even in this case, the semiconductor laser device 20 in a small piece has the same effects as the semiconductor laser device 20 having the semiconductor laser bar 3 and the submount bar 21 that are bar-shaped.

Note that, although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS 3, 3a, 3b, 3c: semiconductor laser bar, 8: protective film particle (material particle), 10: second electrode layer (separated electrode layer), 12: metal pattern, 14: cleaved end face, 15a: front side electrode, 15b: back side electrode, 18: light-emitting region, 19: protective film, 20: semiconductor laser device, 21, 21a, 21b, 21c: submount bar, 22: submount bar body, 23: metal layer, 25: solder, 26: front side electrode, 33: semiconductor laser bar, 40: installation jig, 41: opening member (first opening member, second opening member), 42: fixing plate, 43: opening, 46: pusher, 50: semiconductor device, 60: end face protective film forming apparatus (protective film forming apparatus)

The invention claimed is:
1. A semiconductor laser device manufacturing method of manufacturing a semiconductor laser device in which a protective film is formed on cleaved end faces of a semiconductor laser bar which is a bar-shaped semiconductor laser, the method comprising:
   a material preparation step of forming a metal layer on a front side surface of a bar-shaped submount bar body which is to face the semiconductor laser bar, to prepare a bar-shaped submount bar on which the semiconductor laser bar is to be mounted, wherein the semiconductor laser bar has a front side electrode formed on one surface different from the cleaved end faces and has a back side electrode formed on a surface opposite to the one surface;
   a jig installation step of installing the submount bar and the semiconductor laser bar that are provided in plural number alternately stacked on an installation jig such that the metal layer of the submount bar and the back side electrode of the semiconductor laser bar face each other;
   a bonding step of bonding the metal layer and the back side electrode by increasing a temperature of the installation jig in which the submount bar and the semiconductor laser bar that are provided in plural number are installed; and
   a protective film forming step of forming the protective film on the cleaved end faces of the semiconductor laser bar in a protective film forming apparatus using the installation jig in which the submount bar and the semiconductor laser bar that are provided in plural number are installed, after the bonding step.

2. The semiconductor laser device manufacturing method according to claim 1, wherein the bonding step is performed in the protective film forming apparatus.

3. The semiconductor laser device manufacturing method according to claim 2, wherein, in the protective film forming step, after the protective film is formed on one of the cleaved end faces of the semiconductor laser bar, the protective film is formed on the other of the cleaved end faces of the semiconductor laser bar without disassembling the installation jig.

4. The semiconductor laser device manufacturing method according to claim 2, wherein, in the protective film forming step, after the protective film is formed on one of the cleaved end faces of the semiconductor laser bar, the protective film is formed on the other of the cleaved end faces of the semiconductor laser bar by changing orientation of the installation jig so that material particles of the protective film reach the other of the cleaved end faces of the semiconductor laser bar.

5. The semiconductor laser device manufacturing method according to claim 2, wherein the metal layer is gold, and an outermost surface of the back side electrode facing the metal layer is gold.

6. The semiconductor laser device manufacturing method according to claim 2, wherein, in the material preparation step, solder is formed on a surface of the submount bar on a side opposite to the metal layer.

7. The semiconductor laser device manufacturing method according to claim 2, wherein,
the semiconductor laser bar has a plurality of light emitting regions,
the front side electrode includes a separated electrode layer separated for each of the light emitting regions in a surface distant from the back side electrode, and
in the material preparation step, a metal pattern separated so as not to be in contact with the separated electrode layer at the jig installation step is formed on the surface of the submount bar on the side opposite to the metal layer.

8. The semiconductor laser device manufacturing method according to claim 1, wherein, in the protective film forming step, after the protective film is formed on one of the cleaved end faces of the semiconductor laser bar, the protective film is formed on the other of the cleaved end faces of the semiconductor laser bar without disassembling the installation jig.

9. The semiconductor laser device manufacturing method according to claim 8, wherein the metal layer is gold, and an outermost surface of the back side electrode facing the metal layer is gold.

10. The semiconductor laser device manufacturing method according to claim 8, wherein, in the material preparation step, solder is formed on a surface of the submount bar on a side opposite to the metal layer.

11. The semiconductor laser device manufacturing method according to claim 8, wherein,
the semiconductor laser bar has a plurality of light emitting regions,
the front side electrode includes a separated electrode layer separated for each of the light emitting regions in a surface distant from the back side electrode, and
in the material preparation step, a metal pattern separated so as not to be in contact with the separated electrode layer at the jig installation step is formed on the surface of the submount bar on the side opposite to the metal layer.

12. The semiconductor laser device manufacturing method according to claim 1, wherein, in the protective film forming step, after the protective film is formed on one of the cleaved end faces of the semiconductor laser bar, the protective film is formed on the other of the cleaved end faces of the semiconductor laser bar by changing orientation of the installation jig so that material particles of the protective film reach the other of the cleaved end faces of the semiconductor laser bar.

13. The semiconductor laser device manufacturing method according to claim 12, wherein the metal layer is gold, and an outermost surface of the back side electrode facing the metal layer is gold.

14. The semiconductor laser device manufacturing method according to claim 12, wherein, in the material preparation step, solder is formed on a surface of the submount bar on a side opposite to the metal layer.

15. The semiconductor laser device manufacturing method according to claim 12, wherein,
the semiconductor laser bar has a plurality of light emitting regions,
the front side electrode includes a separated electrode layer separated for each of the light emitting regions in a surface distant from the back side electrode, and
in the material preparation step, a metal pattern separated so as not to be in contact with the separated electrode layer at the jig installation step is formed on the surface of the submount bar on the side opposite to the metal layer.

16. The semiconductor laser device manufacturing method according to claim 1, wherein the metal layer is gold, and an outermost surface of the back side electrode facing the metal layer is gold.

17. The semiconductor laser device manufacturing method according to claim 16, wherein, in the material preparation step, solder is formed on a surface of the submount bar on a side opposite to the metal layer.

18. The semiconductor laser device manufacturing method according to claim 1, wherein, in the material preparation step, solder is formed on a surface of the submount bar on a side opposite to the metal layer.

19. The semiconductor laser device manufacturing method according to claim 1, wherein,
the semiconductor laser bar has a plurality of light emitting regions,
the front side electrode includes a separated electrode layer separated for each of the light emitting regions in a surface distant from the back side electrode, and
in the material preparation step, a metal pattern separated so as not to be in contact with the separated electrode layer at the jig installation step is formed on the surface of the submount bar on the side opposite to the metal layer.

20. The semiconductor laser device manufacturing method according to claim 1, wherein,
the installation jig includes a fixing plate, a first opening member and a second opening member that are fixed to the fixing plate and have openings, and a pusher that presses the submount bar and the semiconductor laser bar that are provided in plural number, and
in the jig installation step, the submount bar and the semiconductor laser bar that are in plural number are arranged on the installation jig such that one of the cleaved end faces and the other of the cleaved end faces in the semiconductor laser bar are exposed from the openings of the first opening member and the second opening member, respectively, and the submount bar and the semiconductor laser bar that are in plural number are fixed and installed on the installation jig in a state of being pressed against the fixing plate by the pusher.

* * * * *